United States Patent
Sugii et al.

(10) Patent No.: US 8,183,635 B2
(45) Date of Patent: May 22, 2012

(54) SEMICONDUCTOR DEVICE

(75) Inventors: Nobuyuki Sugii, Tokyo (JP); Ryuta Tsuchiya, Tokyo (JP); Shinichiro Kimura, Kunitachi (JP); Takashi Ishigaki, Hino (JP); Yusuke Morita, Akishima (JP); Hiroyuki Yoshimoto, Kawasaki (JP)

(73) Assignee: Hitachi, Ltd., Tokyo (JP)

( * ) Notice: Subject to any disclaimer, the term of this patent is extended or adjusted under 35 U.S.C. 154(b) by 230 days.

(21) Appl. No.: 12/756,451

(22) Filed: Apr. 8, 2010

(65) Prior Publication Data

US 2010/0258872 A1    Oct. 14, 2010

(30) Foreign Application Priority Data

Apr. 10, 2009 (JP) ................. 2009-096015

(51) Int. Cl.
*H01L 21/00* (2006.01)

(52) U.S. Cl. ........ 257/351; 257/258; 257/337; 257/379; 257/623; 257/E21.409; 257/E21.546; 257/E21.563; 257/E21.632; 257/E27.111; 257/E29.255

(58) Field of Classification Search ............ 257/258, 257/337, 347, 351, 371, 379, 407, 623, E21.065, 257/409, 415, 546, 563, 628, 632, 703, 27.062, 257/111, 112, 29.255, 261, 275
See application file for complete search history.

(56) References Cited

U.S. PATENT DOCUMENTS

| | | | |
|---|---|---|---|
| 6,333,247 B1* | 12/2001 | Chan et al. | 438/586 |
| 6,613,652 B2* | 9/2003 | Lim et al. | 438/459 |
| 6,720,619 B1* | 4/2004 | Chen et al. | 257/347 |
| 6,939,751 B2* | 9/2005 | Zhu et al. | 438/151 |
| 7,253,068 B1* | 8/2007 | Ju et al. | 438/311 |
| 7,592,675 B2* | 9/2009 | Liaw | 257/371 |
| 7,659,599 B2* | 2/2010 | Booth et al. | 257/510 |
| 2006/0110928 A1* | 5/2006 | Degroote | 438/719 |
| 2006/0128111 A1* | 6/2006 | Beintner et al. | 438/400 |
| 2009/0045462 A1* | 2/2009 | Ren et al. | 257/351 |
| 2011/0108894 A1* | 5/2011 | Sung et al. | 257/288 |
| 2011/0260245 A1* | 10/2011 | Liu et al. | 257/337 |

FOREIGN PATENT DOCUMENTS

JP       2005-251776 A    9/2005

OTHER PUBLICATIONS

Nobuyuki Sugii et al., "Comprehensive Study on $V_{th}$ Variability in Silicon on Thin Box (SOTB) CMOS with Small Random-Dopant Fluctuation: Finding a Way to Further Reduce Variation", International Electron Devices Meeting 2008 Technical Digest, 2008, p. 249-252.

* cited by examiner

Primary Examiner — Michael Lebentritt
(74) Attorney, Agent, or Firm — Miles & Stockbridge P.C.

(57) ABSTRACT

A technique to be applied to a semiconductor device for achieving low power consumption by improving a shape at a boundary portion of a shallow trench and an SOI layer of an SOI substrate. A position (SOI edge) at which a main surface of a silicon substrate and a line extended along a side surface of an SOI layer are crossed is recessed away from a shallow-trench isolation more than a position (STI edge) at which a line extended along a sidewall of a shallow trench and a line extended along the main surface of the silicon substrate are crossed, and a corner of the silicon substrate at the STI edge has a curved surface.

15 Claims, 15 Drawing Sheets

SEMICONDUCTOR DEVICE

CROSS-REFERENCE TO RELATED APPLICATION

The present application claims priority from Japanese Patent Application No. JP 2009-096015 filed on Apr. 10, 2009, the content of which is hereby incorporated by reference into this application.

TECHNICAL FIELD OF THE INVENTION

The present invention relates to a semiconductor device. More particularly, the present invention relates to a technique effectively applied to a semiconductor device formed on an SOI substrate to be mounted on electronics equipments such as low-power information and communication equipments, personal digital appliances, and intelligent home electronics.

BACKGROUND OF THE INVENTION

Performance enhancement such as improvement in operation speed and reduction in power consumption per single transistor of field-effect transistors for logic devices has been achieved along with miniaturization. However, as the feature size reaches sub-40 nm, it becomes difficult to achieve both performance enhancement such as improvement in operation speed and reduction in power consumption per single transistor. Main causes of the problem include a limitation in on-state current due to increase in leakage current of gate dielectric films or velocity saturation of carriers. Accordingly, as means for solving the problems, usage of high-k gate dielectric films or high-mobility channel such as strained silicon have been considered, and they are currently under development. High-k gate dielectric films are mainly aimed for reducing power consumption of electronic circuits during stand-by state by suppressing tunneling current flowing through the thinned gate insulating film. High-mobility channel is aimed for improving operation speed or reducing power consumption in constant-speed state by increasing output current with the same transistor dimensions.

Further, in addition to the above problems, increase of variability in characteristics among large number of transistors has been getting serious along with miniaturization of transistors. To normally operate all circuits, it is necessary to ensure a voltage margin. Therefore, when the characteristic variation is increased, it becomes difficult to achieve supply voltage reduction having been advanced along with miniaturization of transistors. It makes it difficult to reduce power consumption of a single transistor, and it results in increase in power consumption of a semiconductor chip having more transistors per chip along with miniaturization of transistors. Moreover, when the characteristic variation is large, transistors having large power consumption may eventually largely increase power consumption of the semiconductor chip as a whole. Thus, it is becoming difficult to increase the scale of the integration and functions of the integrated circuits without changing power consumption, while it was possible by scaling transistors on a semiconductor chip with the same area size.

Various techniques capable of dramatically improving performance of semiconductor chips by suppressing characteristic variation have been suggested. For example, Japanese Patent Application Laid-Open Publication No. 2005-251776 (Patent Document 1) discloses an SOI (silicon on insulator) technique. This SOI technique uses a substrate including a very thin SOI layer and a buried insulator (BOX: buried oxide) layer to form a fully depleted SOI (FDSOI: fully depleted silicon on insulator) device, and a substrate bias voltage is applied from a back surface of the BOX layer, so that a threshold voltage (Vth) of the FDSOI device can be changed. According to this SOI technique, for example, when power consumption varies to a larger extent, power consumption can be set back to an appropriate value by adjusting the substrate bias voltage of a semiconductor chip after the FDSOI device is manufactured. It results in improving yield of semiconductor chips. Further, when using a circuit configuration in which a semiconductor chip is divided into a plurality of regions and a substrate bias voltage is automatically adjusted independent with each of the regions, characteristics of all FDSOI devices in the semiconductor chips match well, thereby reducing power consumption of the semiconductor ship.

In addition, as N. Sugii et al., International Electron Devices Meeting 2008 Technical Digest, 2008, p. 249 (Non-Patent Document 1) describes, even when the density of dopant atoms to be introduced to the SOI layer is reduced as compared with that of conventional bulk-type transistors, extremely scaled transistors normally operate. Therefore, variations in characteristics due to statistic variation in the number of dopant atoms that is a problem in extremely scaled transistors can be small. It brings an effect of largely improving stability of circuit operation in circuits in which it is important to have matching of transistor pairs in characteristics of, for example, SRAMs (static random access memories).

SUMMARY OF THE INVENTION

In those extremely scaled transistors, generally, when a gate length of a gate electrode is shortened, a channel width is also shortened. For example, when the gate length is 40 nm, the gate width or channel width is 70 nm. When viewing a transistor formed by the SOI technique along the gate width direction, as illustrated in FIG. 1, a shallow trench isolation (STI) 4 is formed on both sides of an SOI layer 1, a BOX layer 2, and a silicon substrate 3 under the BOX layer 2. In FIG. 1, the reference numeral 16 denotes a gate electrode. To focus on the area near the boundary of the SOI layer 1 and the shallow-trench isolation 4, an edge of the SOI layer 1 is bended, and the BOX layer 2 is partially thick. The shape of the BOX layer 2 near the boundary of the SOI layer 1 and the shallow-trench isolation 4 is a so-called "bird's beak" shape.

When the BOX layer 2 has such a bird's beak shape, characteristics of the transistor near the edge of the SOI layer 1, for example, threshold voltage or on-state current are changed. That is, since actual channel widths are different among plurality of transistors even when their designed values are the same, threshold voltages or average values of on-state current differ among the plurality of transistors, resulting in causing difficulties in normal operation in accordance with the circuit design. Further, when the BOX layer 2 is partially thick, characteristics of the transistor, for example, a substrate-bias coefficient (easiness of changing threshold voltage with respect to substrate bias voltage) is also changed, also resulting in difficulties in normal circuit operation. Particularly, due to the change in shape at the edge of the SOI layer 1 and the increase in thickness of the BOX layer 2, off-state current (leakage current during the transistor is OFF) is increased, and thus a problem of an increase in power consumption arises in semiconductor devices having a high integration degree often being extremely scaled.

A preferred aim of the present invention is to provide a technique capable of achieving low power consumption semiconductor devices by improving a shape of a boundary portion of an SOI layer and a shallow-trench isolation of an SOI substrate.

The above and other preferred aims and novel characteristics of the present invention will be apparent from the description of the present specification and the accompanying drawings.

One embodiment of the typical ones of the inventions disclosed in the present application will be briefly described as follows.

The embodiment is a semiconductor device including a field-effect transistor formed on a SOI substrate, the SOI substrate being formed of a silicon substrate and an SOI layer formed on a main surface of the silicon substrate via a BOX layer. The field effect transistor is formed in an active region of the SOI layer surrounded by a shallow trench isolation, wherein the shallow trench isolation is formed of a shallow trench penetrating through the SOI layer and the BOX layer to reach the silicon substrate and an insulator buried inside the shallow trench isolation; and a first position at which the main surface of the silicon substrate and a line extended along a side surface of the SOI layer are crossed is recessed away from the shallow trench isolation more than a second position at which a line extended along a sidewall of the shallow trench and a line extended along the main surface of the silicon substrate are crossed.

In addition, the embodiment is a semiconductor device including a field-effect transistor formed on an SOI substrate, the SOI substrate being formed of a silicon substrate and an SOI layer formed on a main surface of the silicon substrate via a BOX layer. The field-effect transistor is formed in an active region of the SOI layer surrounded by a shallow trench isolation, wherein the shallow trench isolation is formed of a shallow trench penetrating through the SOI layer and the BOX layer to reach the silicon substrate and an insulator buried inside the shallow trench; a first position at which the main surface of the silicon substrate and a line extended along a side surface of the SOI layer are crossed is recessed away from the shallow trench isolation more than a second position at which a line extended along a sidewall of the shallow trench and a line extended along the main surface of the silicon substrate are crossed; and a corner of the silicon substrate at the second position has a curved surface. When a first distance is a distance from the first position and the second position; a second distance is a distance from the second position and a third position at which the curved surface of the mains surface of the silicon substrate are crossed; and a third distance is a difference between the first distance and the second distance, the third distance is larger than zero and larger than or equal to a half of the second distance or larger than or equal to a half of a curvature radius of the curved surface.

The effects obtained by typical aspects of the present invention will be briefly described below.

By improving a shape of a boundary portion of an SOI layer and a shallow trench isolation of an SOI substrate, a reduction of power consumption of semiconductor devices can be achieved.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate or similar shapes and the like are included therein unless otherwise stated or except the case where it is conceivable that they are apparently excluded in principle. The same goes for the numerical value and the range mentioned above.

In the following embodiments, a metal insulator semiconductor field effect transistor (MISFET) representing a field effect transistor will be abbreviated as "MIS," a p-channel type MISFET will be abbreviated as "pMIS," and an n-channel type MISFET will be abbreviated as "nMIS."

Also, components having the same function are denoted by the same reference symbols throughout the drawings for describing the embodiments, and the repetitive description thereof is omitted. Hereinafter, embodiments of the present invention will be described in detail with reference to the accompanying drawings.

First, to more clearly describe an edge structure of an isolation according to a present embodiment of the present invention, a method of forming the isolation which has been studied by the inventors of the present invention will be briefly described.

Figure 2:
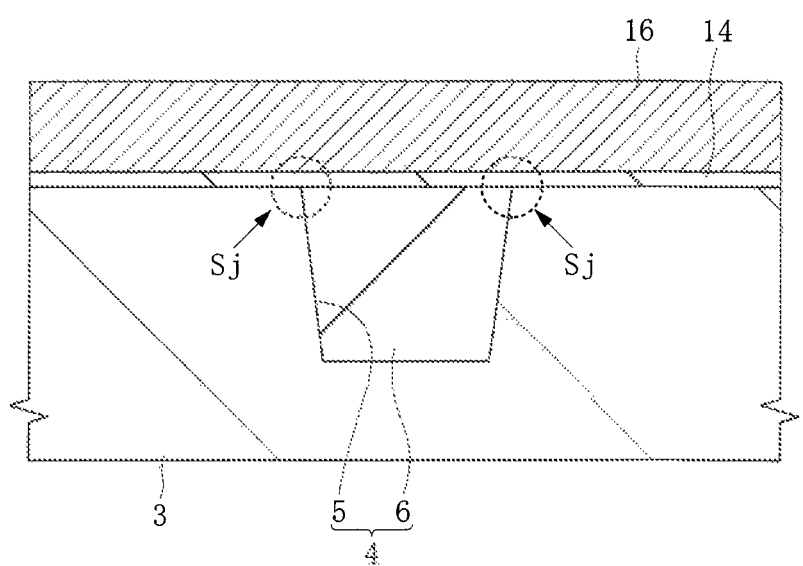
FIG. 2 is a cross-sectional view of a main part of an SOI substrate illustrating a first shallow trench isolation which the inventors of the present invention have studied.

Currently used isolations of semiconductor devices are mainly shallow trench isolation (STI). A method of forming this shallow trench isolation will be described with reference to the cross-sectional view of a main part of a field-effect transistor cut along a channel width direction illustrated in FIG. 2. First, an isolation region is defined by a lithography process and a shallow trench 5 is formed in a silicon substrate 3 by, for example, dry etching. Subsequently, an insulator 6 is deposited on a main surface of a silicon substrate 3, and then a surface of the insulator 6 is polished by, for example, CMP (chemical mechanical polishing) to bury the insulator 6 in the shallow trench 5. A shallow-trench isolation 4 is formed of the insulator 6 buried in the shallow trench 5 in this manner. When viewed from above, a part exposing the silicon substrate to be an active region of the field-effect transistor and another part exposing the insulator 6 of the shallow-trench isolation 4 are formed. Boundary portions Sj (in FIG. 2, the circled regions; simply denoted by STI boundary portions, hereinafter) at which the silicon substrate 3 and the insulator 6 of the shallow-trench isolation 4 are contacted with each other at the main surface of the silicon substrate 3 have an angulated shape when no processing has been performed on the silicon substrate 3. Thereafter, a gate insulating film 14 and a gate electrode 16 are formed on the main surface of the silicon substrate 3.

However, when the shape of the silicon substrate 3 at the STI boundary portions Sj is angulated, an electric field across the gate electrode 16 and the silicon substrate 3 is particularly strong at the STI boundary portions Sj, causing, for example, "kink" to occur in the transistor's characteristics, i.e., Id-Vg characteristics. The kink means characteristics of a drain current which surges when a gate voltage reaches and exceeds a predetermined gate voltage, and the kink causes an increase in leakage current during the field-effect transistor is in an Off state.

Figure 3:
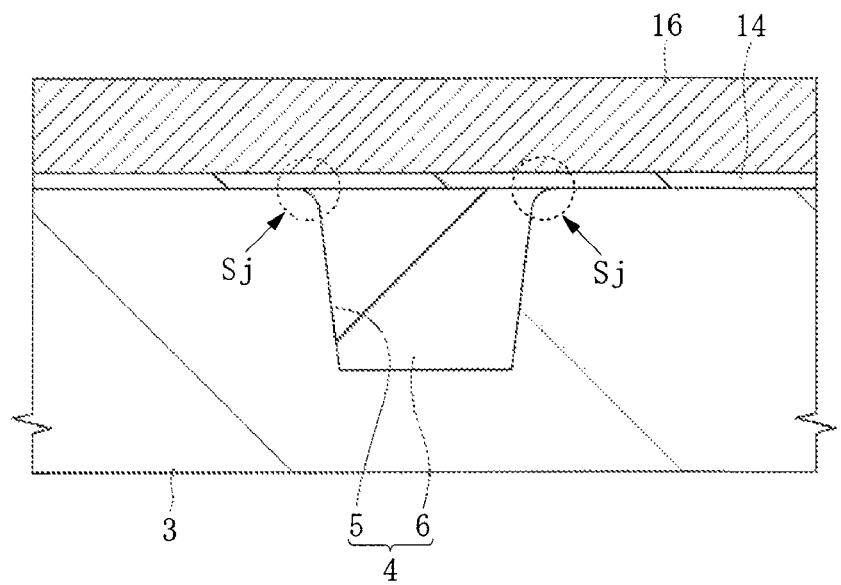
FIG. 3 is a cross-sectional view of a main part of an SOI substrate illustrating a second shallow trench isolation which the inventors of the present invention have studied.

Accordingly, when forming the shallow-trench isolation 4 to the silicon substrate 3, after forming the shallow trench 5 and before burying the insulator 6 inside the shallow trench 5, the silicon substrate 3 is subjected to a thermal oxidation to form a thin thermal-oxide film of about 10 to 20 nm on an inner surface of the shallow trench 5. In this manner, when a thin thermal-oxide film is formed in the inner surface of the shallow trench 5, as illustrated in FIG. 3, the corners of the silicon substrate 3 at the STI boundary portions Sj are trimmed, so that a roundness having a curvature radius of 2 to 10 nm can be provided to the silicon substrate 3 at the STI boundary portions Sj. By providing the roundness to the silicon substrate 3 at the STI boundary portion Sj, the above-mentioned kink occurring in the Id-Vg characteristics can be prevented in the formation of the shallow-trench isolation 4 to the silicon substrate 3.

Figure 1:
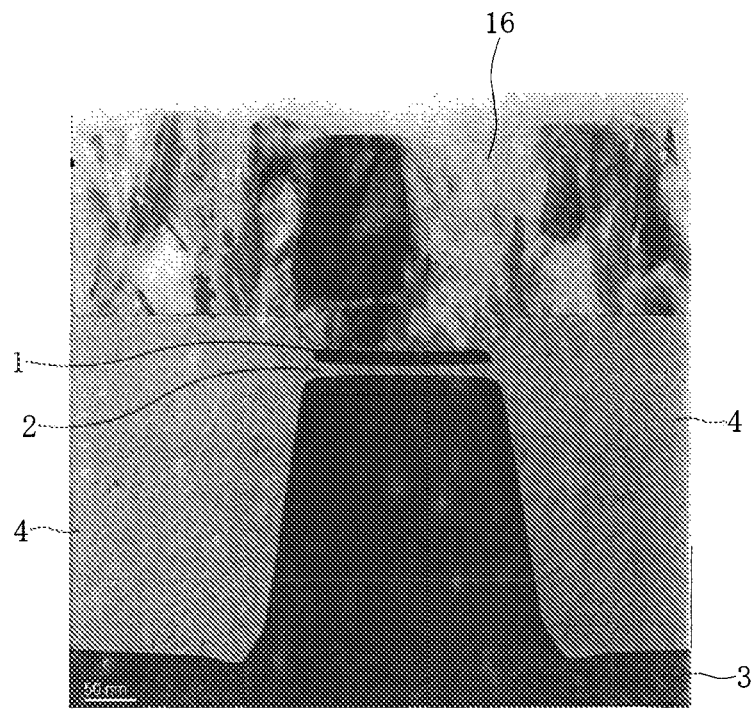
FIG. 1 is a cross-sectional view of a main part of an SOI substrate for explaining a bird's beak shape of a shallow trench isolation which the inventors of the present invention have studied.

However, it has been found out that, when the method of forming the shallow-trench isolation 4 to the silicon substrate 3 is employed for an SOI substrate, a thickness of the BOX layer 2 near the STI boundary portions Sj increases in the step of forming the thermal-oxide film on the inner surface of the shallow trench 5. As a result, as illustrated in FIG. 1 described above, the phenomenon of upward bend of the SOI layer 1 near the STI boundary portion Sj occurs. That is, the thermal oxidation process is performed for solving the kink, but the Id-Vg characteristics are degraded instead. Therefore, it is preferable to eliminate the step of forming the thermal-oxide film on the inner surface of the shallow trench 5.

Meanwhile, in the case of using an SOI substrate, since a thickness of the SOI layer 1 is thin, the kink is hard to occur even when the SOI layer 1 at the STI boundary portions Sj is not extremely rounded as compared with the case of forming the shallow-trench isolation 4 to the silicon substrate 3. If the SOI-type field-effect transistor can be used for all the field-effect transistors to be mounted on a semiconductor chip, a shallow-trench isolation 4 having no thermal-oxide film on the inner surface of the shallow trench can be used. However, as to many semiconductor products, particularly, the ones called system-on-a-chip (SoC), SOI devices and bulk devices (e.g., a device for analog circuit, high-voltage transistor, or electrostatic discharge device, etc.) are often formed on the same substrate. In this case, the above-described shallow-trench isolation 4 having a thermal-oxide film formed on the inner surface of the shallow trench 5 is required with respect to bulk-type field-effect transistors. Therefore, a structure of a shallow-trench isolation which does not negatively affect the characteristics of the SOI-type field-effect transistor even when a thermal oxidation is performed on the inner surface of the shallow trench 5 is necessary.

First Embodiment

According to a study made by the inventors of the present invention, it has been found out that, to avoid the negative effect on the Id-Vg characteristics due to an increase in thickness of the BOX layer 2 near the STI boundary portions Sj, it is effective to recess the edge position of the SOI 1 from the edge position of the shallow-trench isolation 4 viewed from the silicon substrate 3 under the BOX layer 2 side.

Figure 4:
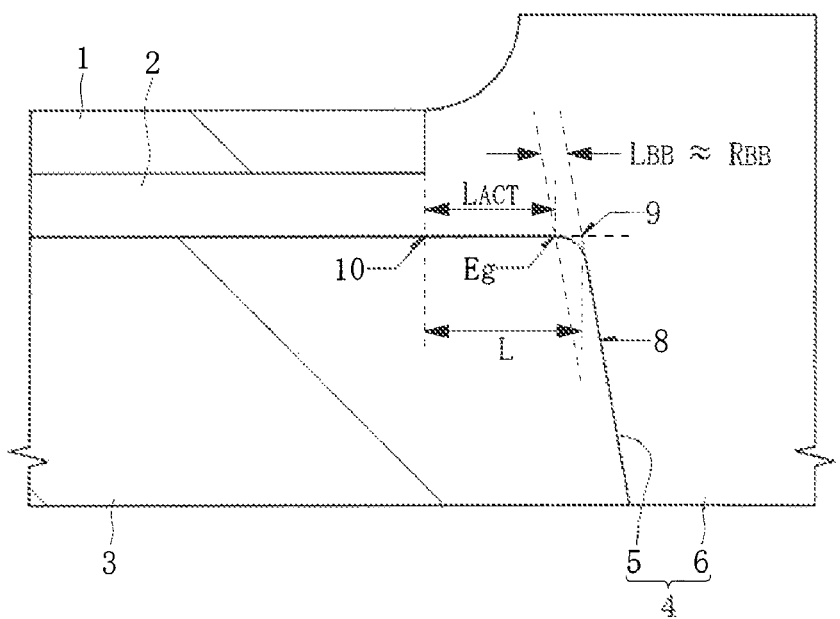
FIG. 4 is an enlarged schematic diagram illustrating a cross section of an STI boundary portion of a first embodiment along a channel-width direction.
Figure 5A:
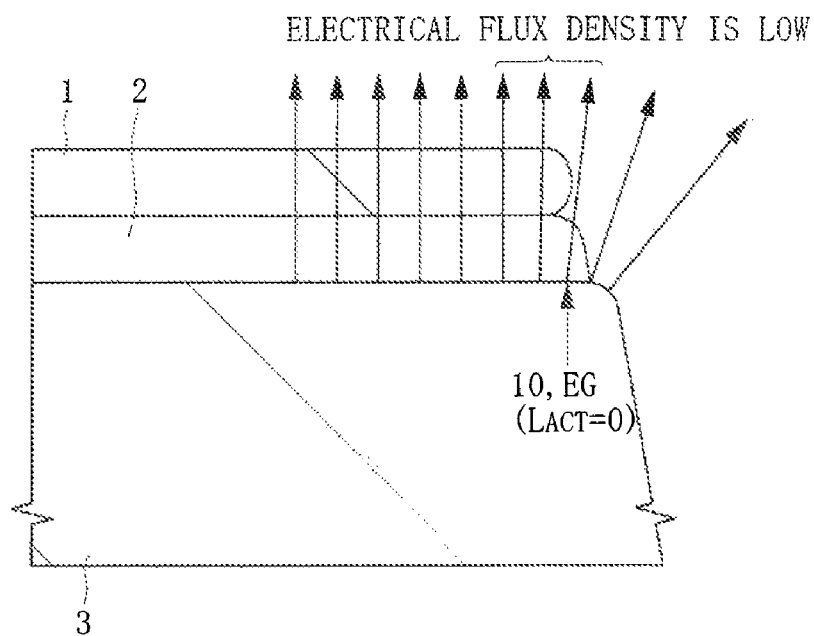
FIG. 5A is an enlarged schematic diagram illustrating a cross section of a conventional STI boundary portion along a channel-width direction.
Figure 5B:
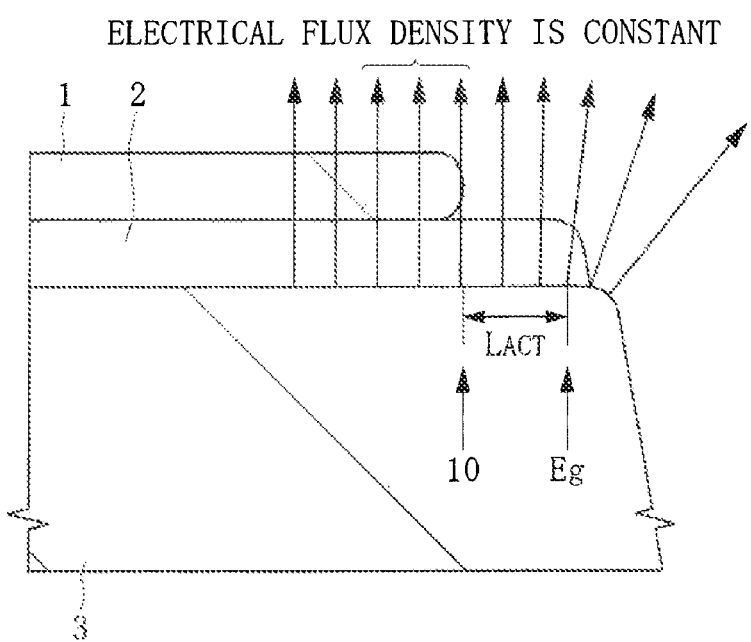
FIG. 5B is an enlarged schematic diagram of a cross section of the STI boundary portion of the first embodiment along the channel-width direction.

Hereinafter, a structure of STI boundary portion Sj according to a first embodiment will be described with reference to FIG. 4 and FIGS. 5A-5B. FIG. 4 is an enlarged schematic diagram illustrating a cross section of an STI boundary portion Sj along a channel-width direction. FIG. 5A is an enlarged schematic diagram illustrating a cross section of a conventional STI boundary portion along a channel-width direction, and FIG. 5B is a schematic diagram of a cross section of the STI boundary portion of the first embodiment along the channel-width direction.

As illustrated in FIG. 4, while dry etching is generally used when forming a shallow trench 5 to a silicon substrate 3, a shallow-trench sidewall 8 is slightly inclined depending on the etching characteristics. A position (second position) at which a line extended along the shallow-trench sidewall 8 and a line extended along a main surface of the silicon substrate 3 are crossed is defined as an STI edge 9. Also, a position (first position) at which the main surface of the silicon substrate 3 and a line extended along a side surface of an SOI layer 1 are crossed is defined as an SOI edge 10. The silicon substrate 3 near the STI edge 9 is rounded, and has a curvature radius, for example, larger than or equal to 1 nm and smaller than or equal to 20 nm. A distance from a position at which the curved surface and the silicon substrate 3 are crossed (or an edge Eg of a bird's beak portion; third position) to the STI edge 9 is defined as a length of a bird's beak portion (second distance) $L_{BB}$. When approximating that the bird's beak portion is a true circle, $L_{BB}$ is equal to a curvature radius $R_{BB}$ of the silicon substrate 3 near the STI edge 9 (hereinafter, denoted as STI edge curvature radius).

With using these definitions, when taking a distance (first distance) from the STI edge 9 to the SOI edge 10 as "L," a recess length (third distance) $L_{ACT}$ from an edge Eg of the bird's beak portion of the SOI edge 10 can be expressed by the following expression.

$$L = L_{ACT} + L_{BB} = L_{ACT} + R_{BB}$$

According to the study made by the inventors of the present invention, to avoid negative affections of the bird's beak shape on the Id-Vg characteristics, it is necessary to recess the SOI edge 10 more than the edge Eg of the bird's beak portion, that is, the recess length $L_{ACT}$ is larger than zero ($L_{ACT}>0$). Preferably, the recess length $L_{ACT}$ is necessary to be larger than or equal to a half of the STI edge curvature radius $R_{BB}$ ($R_{BB} \approx$ the length of bird's beak $L_{BB}$), i.e., $L_{ACT} \geq R_{BB}/2$. Note that the distance L between the STI edge 9 and the SOI edge 10 in the first embodiment is 5 to 30 nm.

Next, the reasons of the above-mentioned conditions will be explained with reference to FIGS. 5A and 5B.

FIG. 5A illustrates a schematic cross-sectional view of the STI boundary portion Sj when the recess length $L_{ACT}$ of the SOI edge 10 is zero (when the SOI edge 10 is positioned on the bird's beak portion). When the recess length $L_{ACT}$ is zero, near the SOI edge 10, a density of the number of electric lines of force from the silicon substrate 3 reaching a gate electrode (not illustrated), i.e., an electrical flux density is low. This means that a threshold voltage of an extremely-scaled field-effect transistor having a short gate length (e.g., about 40 nm) is lowered near the SOI edge 10, and that a substrate-bias coefficient is small regardless of the gate length.

When the STI edge curvature radius $R_{BB}$ is large, the electrical flux density is constant. Thus, recessing the SOI edge 10 more than the edge Eg of the bird's beak portion is necessary (condition of $L_{ACT}>0$) in consideration of a condition for making the electrical flux density sufficiently uniform. However, even this condition cannot perfectly make the electrical flux density uniform at the edge Eg of the bird's beak portion. Thus, it is preferable in consideration of a margin to provide an extra recess of the SOI edge 10 by about a half of the length of the bird's beak portion $L_{BB}$ so that the recess length $L_{ACT}$ of the SOI edge 10 from the edge Eg of the bird's beak portion is larger than or equal to a half of the STI edge curvature radius $R_{BB}$ (condition of $L_{ACT} \geq R_{BB}/2$).

FIG. 5B is a schematic cross-sectional view of the STI boundary portion Sj when the recess length $L_{ACT}$ of the SOI edge 10 is larger than or equal to a half of the STI edge curvature radius $R_{BB}$ ($L_{ACT} \geq R_{BB}/2$). Even when the recess length $L_{ACT}$ of the SOI edge 10 is larger than or equal to a half of the STI edge curvature radius $R_{BB}$, there is no problem in view of the Id-Vg characteristics. However, when the recess length $L_{ACT}$ is too large, an area of an active region of the field-effect transistor or an effective channel width becomes small, and that is not preferable in view of the scale of integration. Therefore, while the above-mentioned condition, i.e., the recess length $L_{ACT}$ is set to be larger than zero ($L_{ACT}>0$) or the recess length $L_{ACT}$ is larger than or equal to a half of the STI edge curvature radius $R_{BB}$ ($L_{ACT} \geq R_{BB}/2$) is satisfied, the recess length $L_{ACT}$ is made as small as possible.

The following describes the feature of the structure of the above-described STI boundary portion Sj in other words. When taking a thickness of the BOX layer 2 as $T_{BOX}$, a thickness of the BOX layer 2 at a center portion of the active region of the field-effect transistor as $TC_{BOX}$, a thickness of the BOX layer 2 at the SOI edge 10 as $TE_{BOX}$, and a deviation in thickness of the BOX layer 2 in the substrate state (which means an SOI substrate before subjected to a device manufacturing process) as $TD_{BOX}$, the feature can be expressed by the following expression.

$$TC_{BOX} - TD_{BOX} \leq TE_{BOX} \leq TC_{BOX} + TD_{BOX}$$

Here, the deviation in thickness $TD_{BOX}$ of the BOX layer 2 is, according to current SOI substrate manufacturing technology, 1 nm or less even in consideration of an inter-lot deviation etc., and thus is sufficiently smaller than the STI edge curvature radius $R_{BB}$. Thus, approximately, $TE_{BOX} = TC_{BOX}$.

As described above, if the step of forming a thermal oxide film on an inner surface of a shallow trench 5 is eliminated, characteristics of the SOI field-effect transistor are improved. However, also in this case, employing the structure satisfying the above-mentioned condition ($L_{ACT}>0$ or $L_{ACT} \leq R_{BB}/2$) for the STI boundary portion Sj is more effective for achieving more stable Id-Vg characteristics. Further, even if the step of forming a thermal oxide film on an inner surface of a shallow trench 5 is eliminated, due to a thermal processing or an oxidation step in the manufacturing process of the SOI-type field-effect transistor, there is a possibility of causing a bird's beak shape to occur as the thickness of the BOX layer 2 close to a surface is increased because the thickness of the SOI layer 1 is small. Therefore, it is preferable to employ the structure satisfying the above-mentioned condition ($L_{ACT}$>0 or $L_{ACT} \geq R_{BB}/2$) for the STI boundary portion Sj.

As described above, according to the first embodiment, when the field-effect transistor is formed on an SOI substrate, the following effects can be obtained.

The following four points are listed as effects of satisfying the condition of $TC_{BOX} - TD_{BOX} \leq TE_{BOX} \leq TC_{BOX} + TD_{BOX}$ that the thickness of the BOX layer 2 is substantially uniform in the active region. (1) Uniformity of the Id-Vg characteristics can be maintained regardless of the gate length because a short-channel-effect immunity of the SOI edge 10 is as same as that of the center portion of the active region. (2) As the threshold voltage at the SOI edge 10 is the same as that at the center portion of the active region, the threshold voltage is constant regardless of the gate width. (3) Subthreshold characteristics are uniform. (4) On-Off characteristics of the field-effect transistor are constant regardless of the channel width.

In addition, the following two points are listed as effects obtained by satisfying the condition of $L_{ACT}$>0 or $L_{ACT} \geq R_{BB}/2$ that the electrical flux density is substantially uniform. (5) Change in the threshold voltage to be caused when a concentration of dopants added to the silicon substrate 3 is changed is substantially constant regardless of the channel width. (6) Change in the threshold voltage, i.e., the substrate-bias coefficient upon applying a substrate bias voltage is substantially constant regardless of the channel width.

As all the above-listed effects are considered together, characteristics of an extremely scaled field-effect transistor to be used in semiconductor devices have an improved uniformity regardless of changes in dimensions. Therefore, a deviation of circuit characteristics is small, and thus an operational margin of the circuit can be small as a result. Consequently, an improvement in performance per power of the semiconductor device can be achieved, in other words, the semiconductor device can be operated with lower power with the same level of performance, and the semiconductor device can have more performance with the same level of power.

Figure 18:
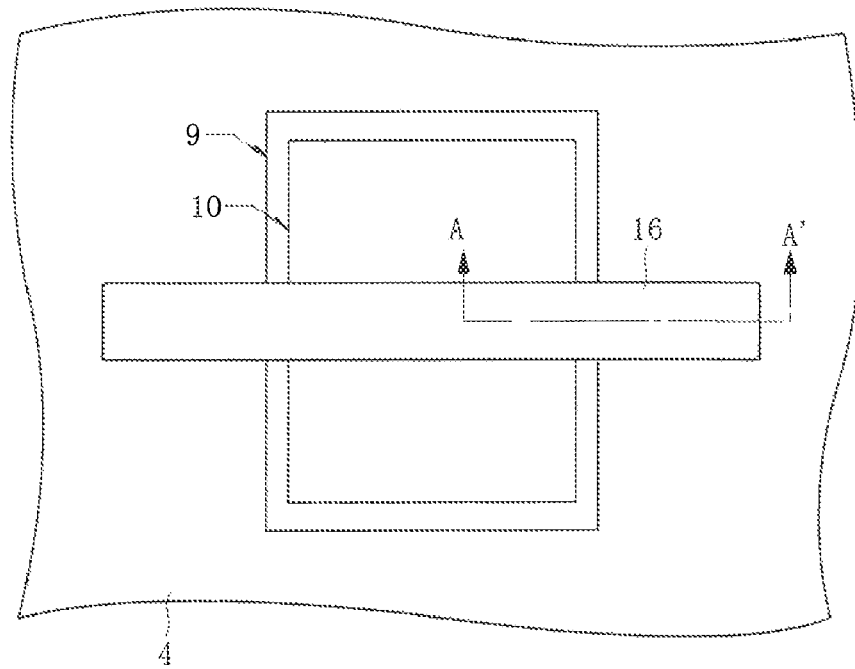
FIG. 18 is a plan view of a main part in the manufacturing process of the field-effect transistor continued from FIG. 17.
Figure 19:
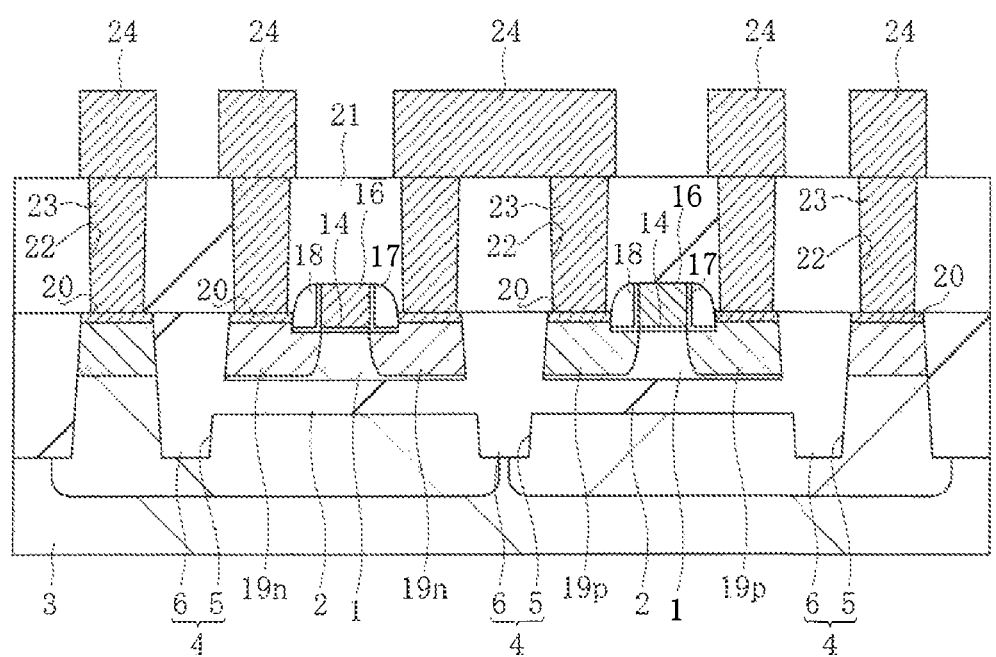
FIG. 19 is a cross-sectional view of a main part in the manufacturing process of the field-effect transistor continued from FIG. 18.
Figure 20:
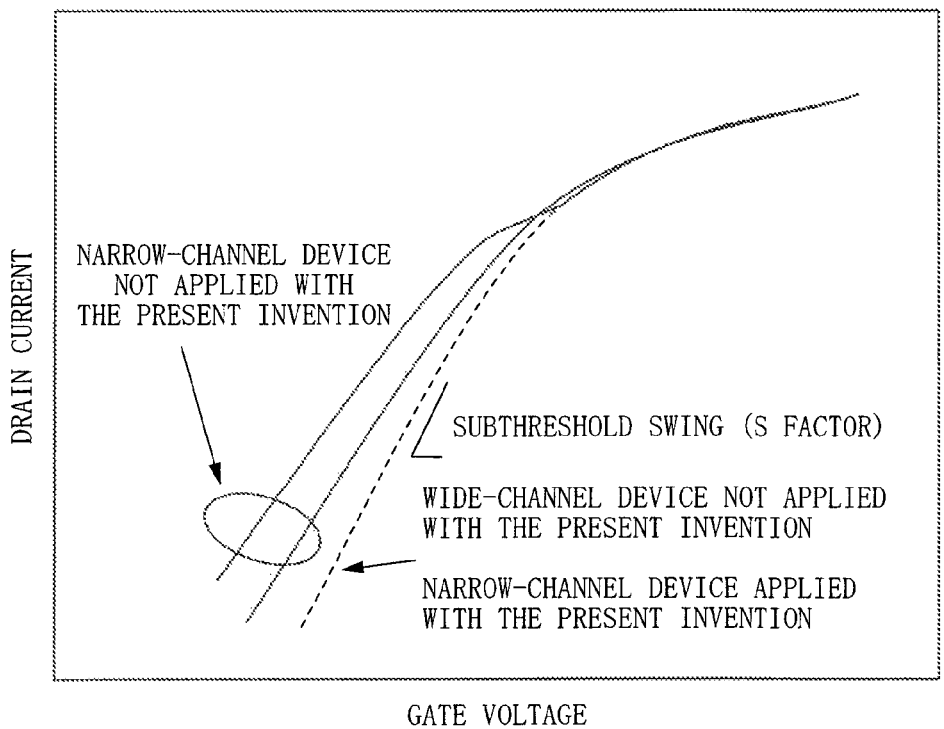
FIG. 20 is a graph describing a relationship of a drain current (Id) and a gate voltage (Vg) of the field-effect transistor according to the first embodiment.
Figure 21:
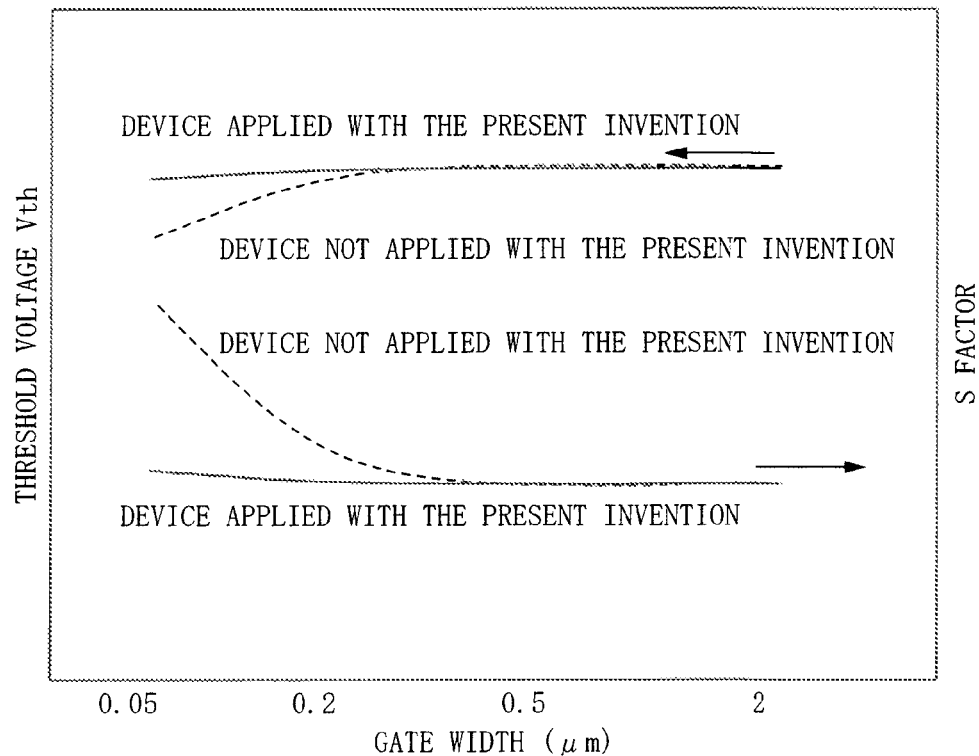
FIG. 21 is a graph describing a relationship of a threshold voltage (Vth) and a gate width of the field-effect transistor according to the first embodiment.
Figure 22:
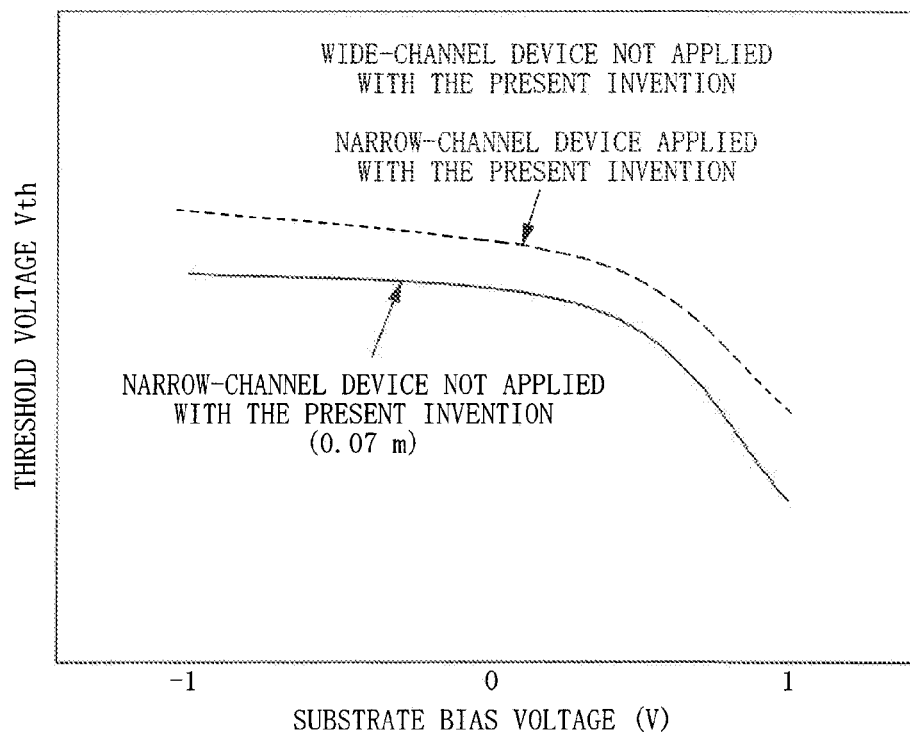
FIG. 22 is a graph describing a relationship of a threshold voltage and a substrate bias of the field-effect transistor according to the first embodiment.

Next, a method of manufacturing the field-effect transistor to be mounted on the semiconductor device according to the first embodiment will be described in order of steps with reference to FIGS. 6 to 22. FIGS. 6 to 17 are cross-sectional views of a main part of the field-effect transistor, FIG. 18 is a plan view of a main part of the field-effect transistor, FIG. 19 is a cross-sectional view of a main part of the field-effect transistor, FIG. 20 is a graph illustrating a relationship of a drain current (Id) and a gate voltage (Vg) of the field-effect transistor, FIG. 21 is a graph illustrating a relationship of a threshold voltage (Vth) and a gate width of the field-effect transistor, and FIG. 22 is a graph describing a relationship of a threshold voltage (Vth) and a substrate bias of the field-effect transistor.

Figure 6:
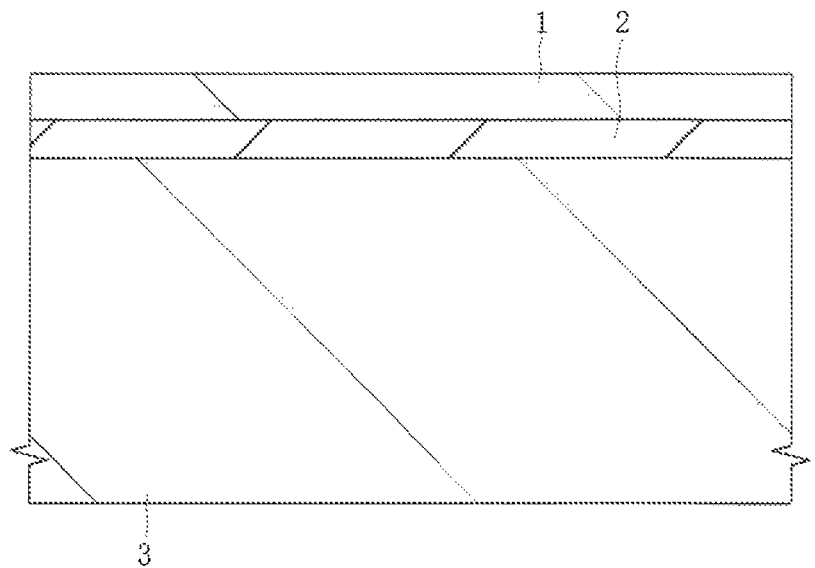
FIG. 6 is a cross-sectional view of a main part of a semiconductor substrate illustrating a manufacturing process of a field-effect transistor according to the first embodiment.

First, an SOI substrate consisted of the silicon substrate 3, the BOX layer 2, and the SOI layer 1 as illustrated in FIG. 6 is prepared. The silicon substrate 3, for example, has a surface orientation of (100) and is formed of p-type single crystal silicon having a resistivity of 5 Ωcm. The SOI layer 1 is formed of, for example, p-type single crystal silicon having (100) surface orientation, <100> crystallographic orientation in a direction parallel to an orientation-flat or a notch, and a thickness of 20 nm. The BOX layer 2 is formed of, for example, a silicon dioxide film having a thickness of 10 nm.

Next, the shallow-trench isolation 4 according to the first embodiment is formed. In the following, a process of forming the shallow-trench isolation 4 will be described in sequence with reference to FIGS. 7 to 16.

Figure 7:
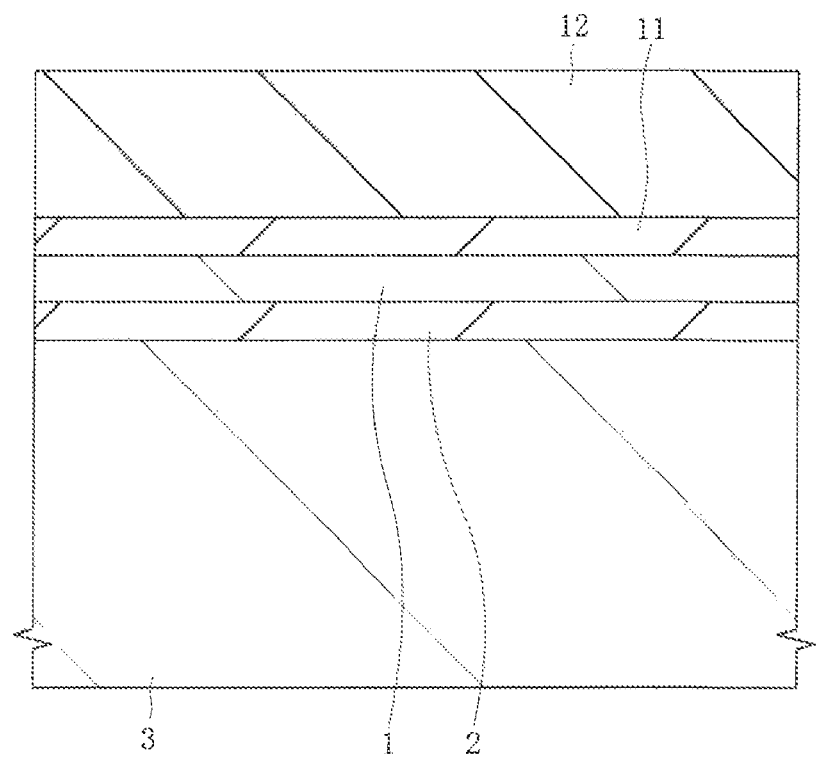
FIG. 7 is a cross-sectional view of a main part same as that of FIG. 6 in the manufacturing process of the field-effect transistor continued from FIG. 6.

As illustrated in FIG. 7, a silicon dioxide film 11 and a silicon nitride film 12 are sequentially formed on a main surface of the SOI substrate. The silicon dioxide film 11 is formed by, for example, thermal oxidation, and has a thickness of about 10 nm. The silicon nitride film 12 is formed by, for example, CVD (chemical vapor deposition), and has a thickness of about 120 nm. The silicon nitride film 12 will function as a stopper layer in a CMP process described later, and the silicon dioxide film 11 functions as a base of the silicon nitride film 12 and as a protective film of the active region of the SOI layer 1 or the silicon substrate 3. Note that, at this time, silicon of the SOI layer 1 is consumed by the formation of the silicon dioxide film 11 and thus a thickness of the SOI layer 1 is reduced to be about 15 nm.

Figure 8:
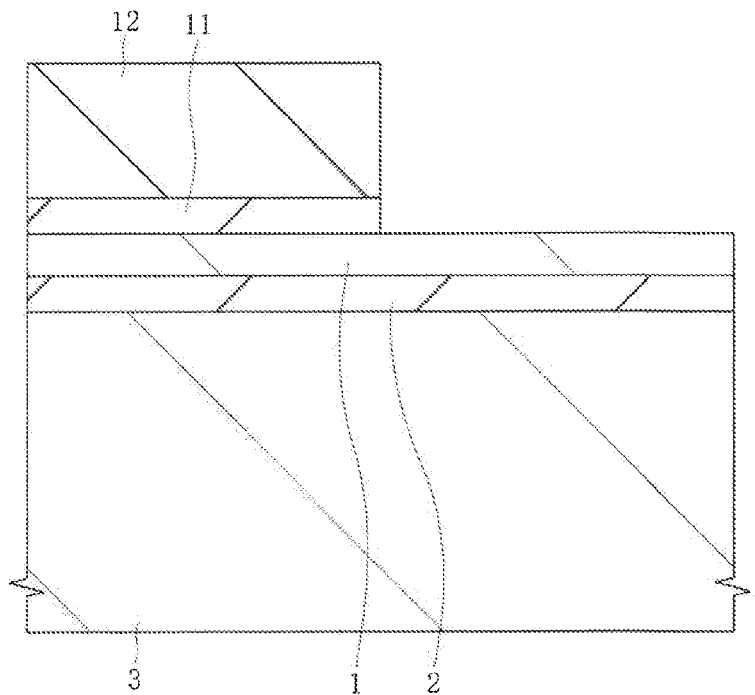
FIG. 8 is a cross-sectional view of a main part same as that of FIG. 6 in the manufacturing process of the field-effect transistor continued from FIG. 7.

Next, as illustrated in FIG. 8, a resist pattern defining an isolation region is formed by photolithography, and the silicon nitride film 12 and the silicon dioxide film 11 in the isolation region are removed by dry etching with using the resist pattern as a mask.

Figure 9:
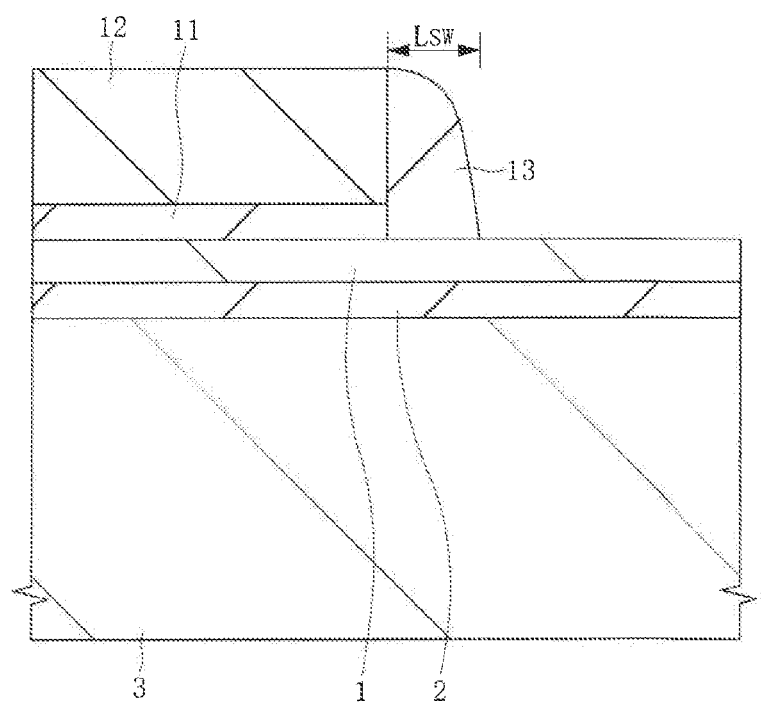
FIG. 9 is a cross-sectional view of a main part same as that of FIG. 6 in the manufacturing process of the field-effect transistor continued from FIG. 8.

Next, as illustrated in FIG. 9, a silicon dioxide film having a thickness of, for example, about 30 nm is deposited on the main surface of the SOI substrate by CVD, and then the silicon dioxide film is processed by anisotropic etching so that a sidewall 13 is formed on a sidewall of the stacked film of the silicon dioxide film 11 and the silicon nitride film 12. A width $L_{SW}$ of the sidewall 13 is, for example, about 30 nm. When forming the sidewall 13, the SOI layer 1 is not etched because anisotropic etching having selectivity with respect to silicon is used. Here, 30 nm has been exemplified as the width $L_{SW}$ of the sidewalls 13, but the width can be changed in accordance with a setting value of the recess length $L_{ACT}$ described above.

Figure 10:
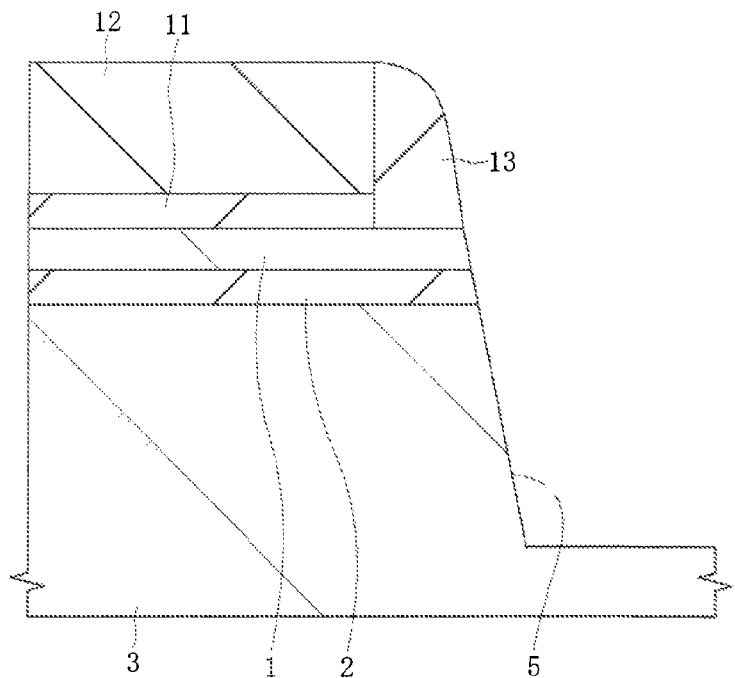
FIG. 10 is a cross-sectional view of a main part same as that of FIG. 6 in the manufacturing process of the field-effect transistor continued from FIG. 9.

Next, as illustrated in FIG. 10, the shallow trench 5 is formed to the silicon substrate 3 by anisotropic etching. With using the silicon nitride film 12 and the sidewall 13 as a mask, the SOI layer 1, the BOX layer 2, and the silicon substrate 3 are etched in this order with switching etching gases accordingly. A depth of the shallow trench 5 is, for example, 300 nm. In FIG. 10, a part of the isolation region and a part of one side surface of the shallow trench 5 are illustrated. It is absolutely the same with a normal formation method of an isolation region in that the other side surface of the shallow trench 5 has a symmetrical shape.

Figure 11:
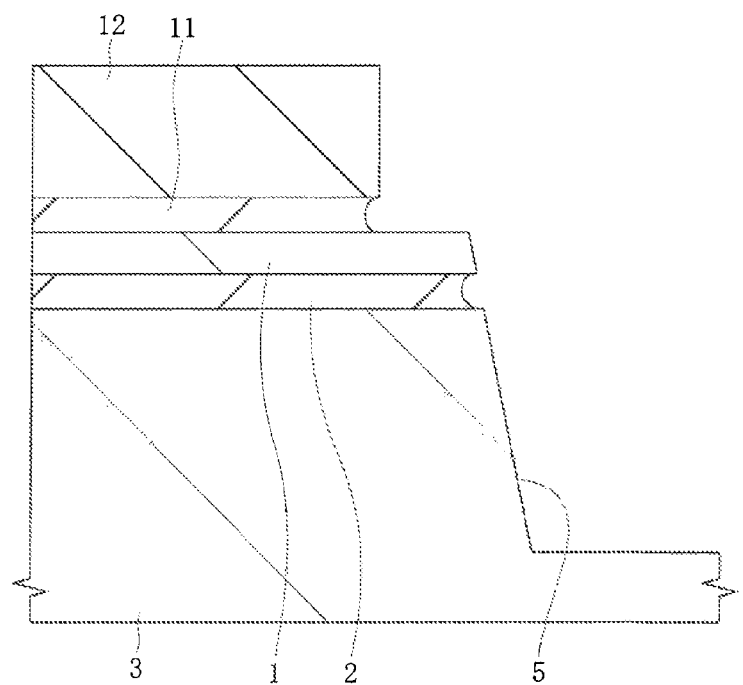
FIG. 11 is a cross-sectional view of a main part same as that of FIG. 6 in the manufacturing process of the field-effect transistor continued from FIG. 10.

Next, as illustrated in FIG. 11, the sidewall 13 is removed by wet etching. Exposed parts of side surfaces of the BOX layer 2 and silicon dioxide film 11 are slightly corroded.

Figure 12:
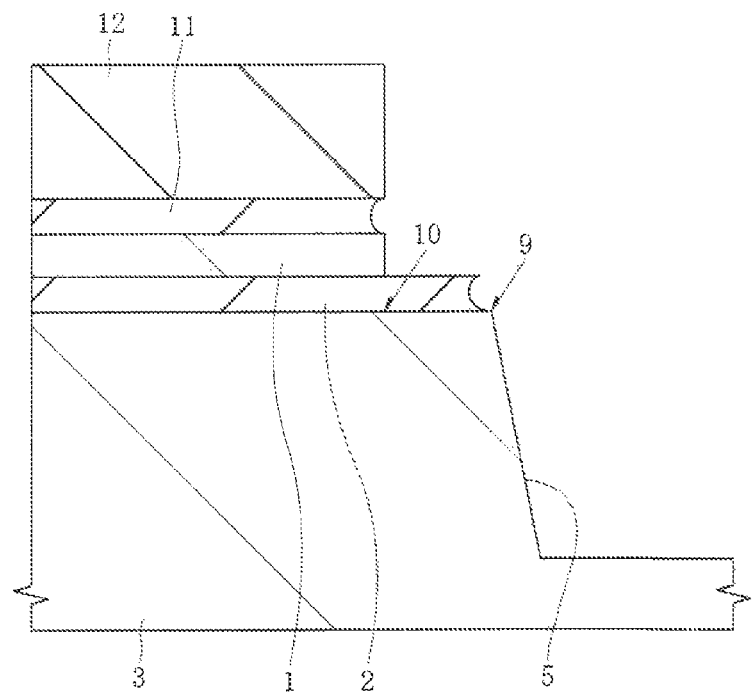
FIG. 12 is a cross-sectional view of a main part same as that of FIG. 6 in the manufacturing process of the field-effect transistor continued from FIG. 11.

Next, as illustrated in FIG. 12, an exposed part of the SOI layer 1 is removed by anisotropic etching with using the silicon nitride film 12 as a mask. By this step, the structure in which the SOI edge 10 is recessed from the STI edge 9 is finished.

Figure 13:
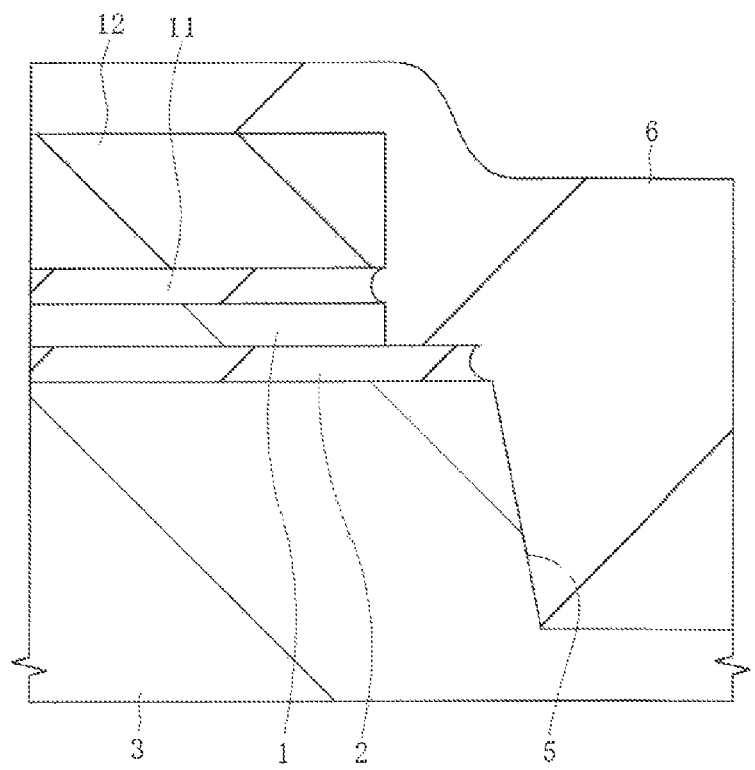
FIG. 13 is a cross-sectional view of a main part same as that of FIG. 6 in the manufacturing process of the field-effect transistor continued from FIG. 12.

Next, as illustrated in FIG. 13, the insulator 6 is formed on the main surface of the SOI substrate. The insulator 6 is formed by, for example, HDP (high density plasma) CVD.

Figure 14:
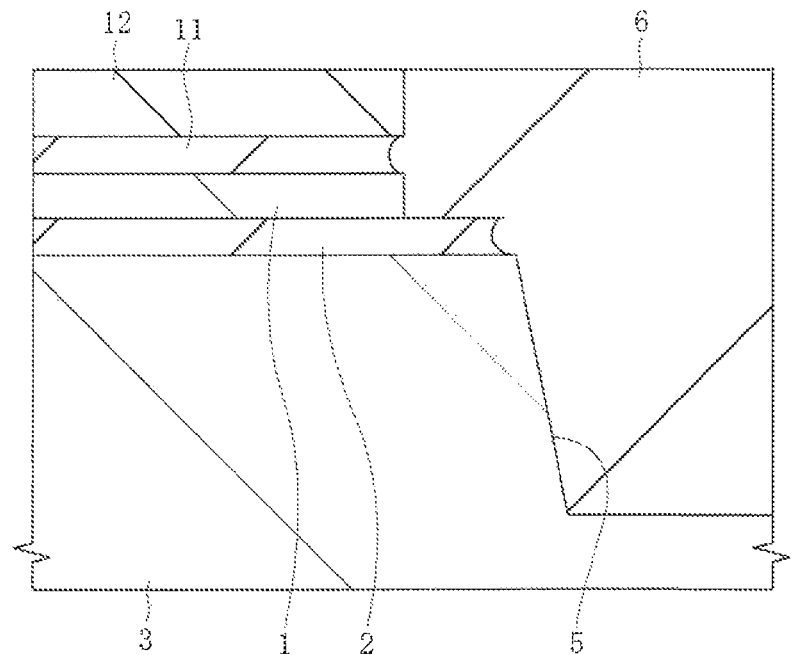
FIG. 14 is a cross-sectional view of a main part same as that of FIG. 6 in the manufacturing process of the field-effect transistor continued from FIG. 13.

Next, as illustrated in FIG. 14, the insulator 6 is subjected to a CMP processing to be planarized. By adjusting an amount of polishing of the insulator 6, a remaining thickness of, for example, the silicon nitride film 12 is about 30 nm.

Figure 15:
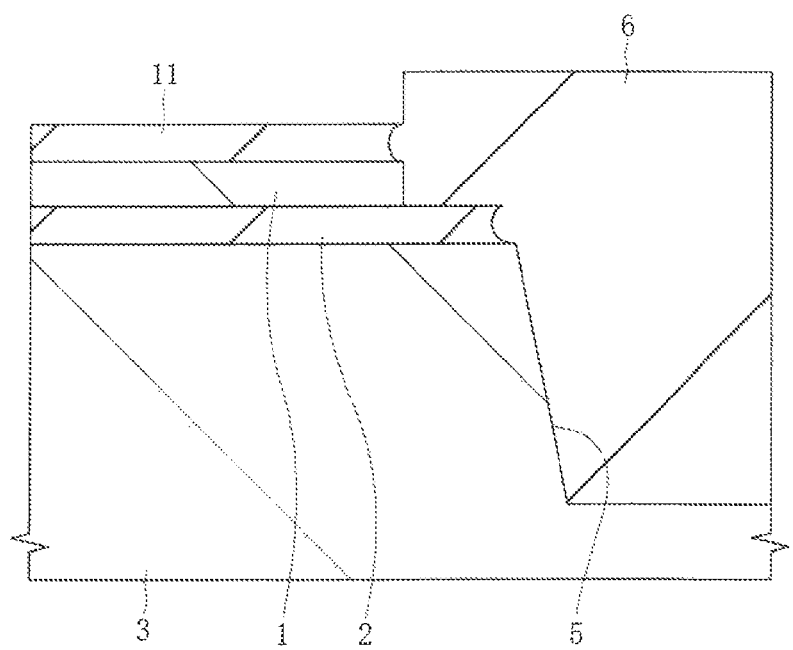
FIG. 15 is a cross-sectional view of a main part same as that of FIG. 6 in the manufacturing process of the field-effect transistor continued from FIG. 14.

Next, as illustrated in FIG. 15, the silicon nitride film 12 is removed by wet etching using phosphoric acid.

Figure 16:
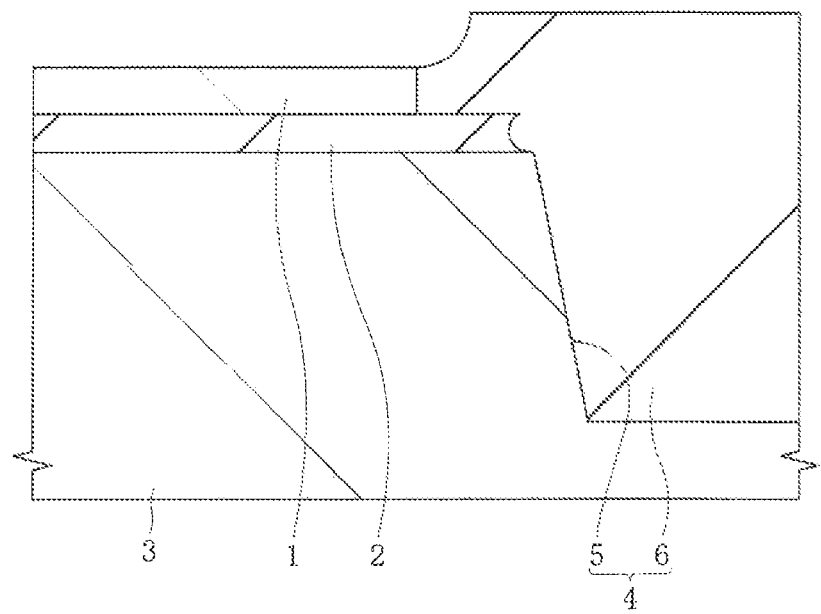
FIG. 16 is a cross-sectional view of a main part same as that of FIG. 6 in the manufacturing process of the field-effect transistor continued from FIG. 15.

Next, as illustrated in FIG. 16, part of the silicon dioxide film 11 on the SOI layer 1 and the insulator 6 in the isolation region is removed by wet etching. A height difference from an exposed surface of the SOI layer 1 to a surface of the insulator 6 in the isolation region is suitably adjusted by a thickness of the silicon dioxide film 11, a thickness of remained silicon nitride film 12 after the polishing by CMP, and a wet-etching amount in the present wet etching so that the height difference matches formation conditions of a gate electrode. According to the manufacturing process described with reference to FIGS. 2 to 16, the shallow-trench isolation 4 is finished.

Next, the field-effect transistor according to the first embodiment is formed. Hereinafter, a process of manufacturing the field-effect transistor will be described with reference to FIGS. 17 to 19. Each of the steps described below is not directly related to main contents of the present invention and is in accordance with a generally-used manufacturing process of a field-effect transistor. Thus, the steps can be suitably changed in accordance with specifications and/or purposes of products, and effects of the present invention will not be changed by the change. In the first embodiment, a CMOS (complementary metal oxide semiconductor) device will be exemplified as the field-effect transistor.

A conventional well-implantation step is carried out to the SOI substrate having the cross-sectional shape illustrated in FIG. 16 described above. Since the field-effect transistor exemplified in the first embodiment is a CMOS device, a dopant exhibiting p-type conductivity is implanted into the silicon substrate 3 in an n-MIS region, and a dopant exhibiting n-type conductivity is implanted into the silicon substrate 3 in a p-MIS region. While the transistor is an SOI-type field-effect transistor here, since the thickness of the SOI layer 1 after being subjected to the step of isolation region formation is about 15 nm and the thickness of the BOX layer 2 is about 10 nm, both being very thin, almost all the dopants can be implanted into the silicon substrate 3 if acceleration energy is suitably adjusted upon implanting the dopants from the surface of the SOI layer 1 in the active region. To adjust the distribution of the dopants in the depth direction, a plurality of repetitions of ion-implantation steps having different acceleration energies and implantation amounts may be combined. Threshold voltages of the nMIS and pMIS can be suitably adjusted according to the implantation amounts of the dopants and temperature and time of a thermal processing to be carried out to the SOI substrate thereafter.

Figure 17:
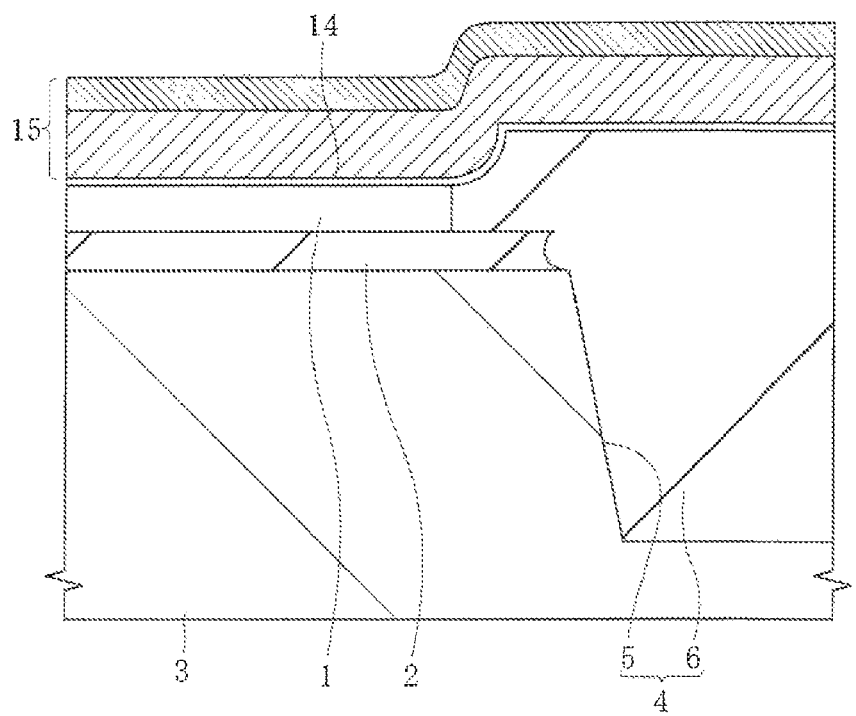
FIG. 17 is a cross-sectional view of a main part same as that of FIG. 6 in the manufacturing process of the field-effect transistor continued from FIG. 16.

Next, as illustrated in FIG. 17, after forming a gate insulating film 14 on the surface of the SOI layer 1, a conductive film 15 to form a gate electrode is formed on the gate insulating film 14. The gate insulating film 14 is formed of, for example, a HfSiON-based high-dielectric-constant film, and the conductive film 15 is formed of, for example, a stacked film of a polycrystalline silicon film and a titanium nitride film stacked sequentially. A thickness of the polycrystalline silicon film is, for example, about 85 nm, and a thickness of the titanium nitride film is, for example, about 15 nm. To the polycrystalline silicon film, to obtain a sufficiently low conductivity, a dopant is added at a high concentration. While the structure has the SOI edge 10 being recessed with respect to the STI edge 9, the gate insulating film 14 and the conductive film 15 are formed continuously without a cutoff in accordance with the above-mentioned suitable setting of the step therebetween, and thus an electric-field concentration or an increase of leakage current will not occur at the STI boundary portions Sj.

Next, as illustrated in FIG. 18, a resist pattern defining a gate electrode region is formed by photolithography. A gate width of a gate electrode is, for example, smaller than or equal to 100 nm, and a gate length is, for example, 50 nm. Here, the ArF stepper is used to set the gate length to be 30 nm. With using the resist pattern as a mask, the conductive film 15 is processed by dry etching, so that a gate electrode 16 is formed. In FIG. 18, the outer rectangle surrounding the active region indicates the STI edge 9, and the inner rectangle indicates the SOI edge 10. This layout is absolutely the same with that of the conventional field-effect transistor except for the point that the SOI edge 10 is recessed from the STI edge 9. Note that the cross-sectional views of a main part illustrated in FIGS. 6 to 17 are enlarged diagrams of the cross section cut along the line A-A' illustrated in FIG. 18.

Next, as illustrated in FIG. 19, a silicon dioxide film 17 having a thickness of, for example, about 10 nm is formed on the main surface of the SOI substrate. Subsequently, a dopant exhibiting n-type conductivity (e.g., phosphorus or arsenic) is ion-implanted into the SOI layer 1 on both sides of the gate electrode 16 in the nMIS region, so that n-type extension regions of the nMIS are formed. Similarly, a dopant exhibiting p-type conductivity (e.g., boron fluoride ($BF_2$)) is ion-implanted to the SOI layer 1 on the both sides of the gate electrode 16 in the pMIS region, so that p-type extension regions in the pMIS are formed.

Next, after forming a silicon nitride film having a thickness of, for example, about 25 nm on the main surface of the SOI substrate, the silicon nitride film is processed by anisotropic dry etching, thereby forming sidewalls 18 formed of the silicon nitride film. Subsequently, an n-type dopant is ion-implanted into the SOI layer 1 in the nMIS region to form n-type diffusion regions self-aligned with the gate electrode 16 and the sidewalls 18, thereby forming the n-type extension regions and source/drain regions 19n of the nMIS formed of the n-type diffusion regions. Similarly, a dopant exhibiting p-type conductivity is ion-implanted into the SOI layer 1 in the pMIS region to form p-type diffusion regions self-aligned with the gate electrode 16 and the sidewalls 18, thereby forming the p-type extension regions and source/drain regions 19p of pMIS formed of the p-type diffusion regions.

Note that resistances of the sources/drains 19n and 19p may be lowered by forming a raised structure by selective silicon epitaxial growth before forming the n-type extension regions and the p-type extension regions, or before forming the n-type diffusion regions and the p-type diffusion regions.

Next, self-aligned silicide layers 20 are formed on the surface of the SOI layer 1 where the source/drain 19n and 19p are formed. Subsequently, an interlayer insulating film 21 is formed on the main surface of the SOI substrate, and then the interlayer insulating film 21 is processed by dry etching with using a resist pattern as a mask to form via holes 22. The via holes 22 are formed on necessary positions of, for example, the sources/drains 19n and 19p. Subsequently, after forming a plug 23 inside the via hole 22, wirings 24 to be a first layer to be connected to the plug 23 are formed. Thereafter, wirings of upper layers will be formed, but illustrations thereof are omitted. According to the manufacturing steps described above with reference to FIGS. 17 to 19, the field-effect transistor according to the first embodiment is finished. Note that the manufacturing steps of the shallow-trench isolation 4 and the field-effect transistor described above is the most fundamental ones.

By employing a structure according to the first embodiment, in which the SOI edge 10 is recessed more than the STI edge 9, for the STI boundary portion Sj of the shallow-trench isolation 4, the kink, short-channel effect characteristics, and a changes in substrate-bias coefficient occurring in Id-Vg characteristics can be prevented regardless of the gate width (channel width) of the field-effect transistor.

In FIG. 20, Id-Vg characteristics of the field-effect transistor are illustrated. In the case of a conventional field-effect transistor having an STI boundary portion Sj to which the present invention is not applied, characteristics of a wide-channel field-effect transistor are normal as illustrated by a dotted line. Meanwhile, characteristics of a narrow-channel field-effect transistor have the kink as illustrated by a solid line and also has a large subthreshold swing (S factor). In contrast, in the case of the field-effect transistor according to the first embodiment, even it is a narrow-channel field-effect transistor, characteristics thereof match with those of the wide-channel field-effect transistor illustrated by a broken line.

Further, in FIG. 21, gate-width dependencies of the threshold voltages of the field-effect transistors are illustrated. In the case of the conventional field-effect transistor having the STI boundary portion Sj to which the present invention is not applied, the threshold voltage and S factor are dependent on the gate width. Meanwhile, in the field-effect transistor according to the first embodiment, the threshold voltage and S factors are not dependent on the gate width.

Moreover, in FIG. 22, substrate-bias-voltage dependencies of the threshold voltages of the field-effect transistors are illustrated. In the case of the conventional field-effect transistor having the STI boundary portion Sj to which the present invention is not applied, characteristics of the wide-channel field-effect transistor are different from those of the narrow-channel field effect transistor. In contrast, in the case of the field-effect transistor according to the first embodiment, even if it is a narrow-channel field-effect transistor, characteristics thereof match with those of the wide-channel field-effect transistor indicated by a broken line.

Second Embodiment

Figure 23:
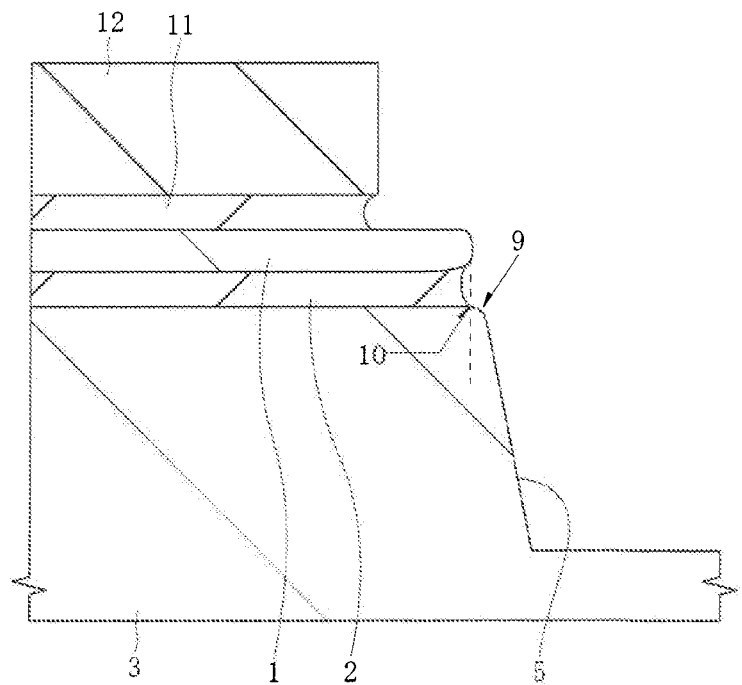
FIG. 23 is a cross-sectional view of a main part of a semiconductor substrate illustrating a manufacturing process of a field-effect transistor according to a second embodiment.
Figure 24:
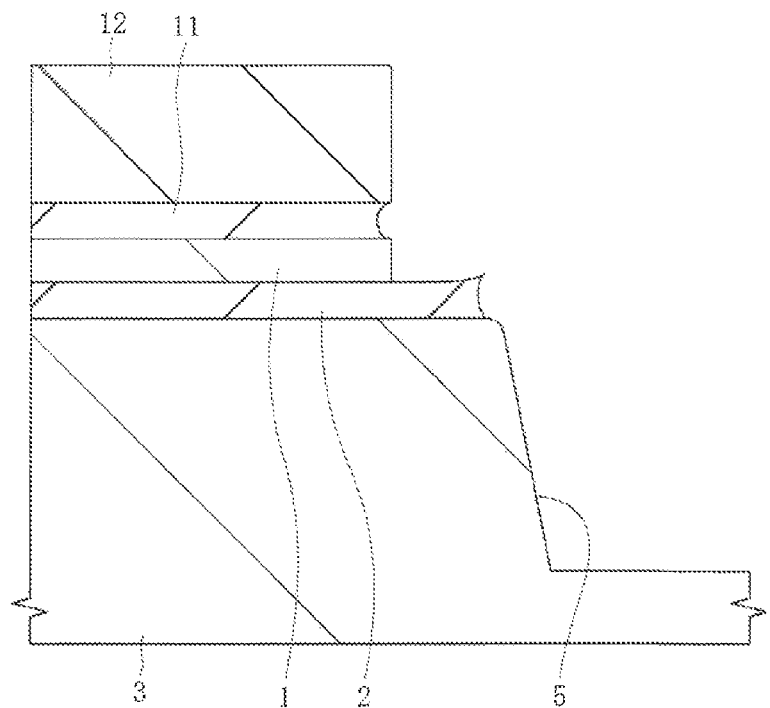
FIG. 24 is a cross-sectional view of a main part same as that of FIG. 23 in the manufacturing process of the field-effect transistor continued from FIG. 23.

A semiconductor device according to a second embodiment is similar to that of the first embodiment described above, and the shape of the STI edge 9 is different from that of the first embodiment while the structure in which the SOI edge 10 is recessed more than the STI edge 9 is employed to the STI boundary portion Sj of the shallow-trench isolation 4. That is, while the STI edge 9 of the above-described first embodiment has a shape processed vertically and left as it is, the STI edge 9 of the second embodiment is processed to be rounded. A method of manufacturing such a shallow-trench isolation 4 according to the second embodiment will be described with reference to FIGS. 23 and 24 in order of manufacturing steps. FIGS. 23 and 24 are cross-sectional views of a main part illustrating the method of manufacturing the shallow-trench isolation 4. Note that the manufacturing process until forming the shallow trench 5 to the silicon substrate 3 and removing the sidewall 13 (above-described FIG. 11) is the same with that of the first embodiment, and thus descriptions thereof are omitted here.

First, after obtaining the structure illustrated in FIG. 11 of the first embodiment described above, the SOI substrate is subjected to a rapid thermal oxidation (ISSG: in-situ steam generation). In this manner, as illustrated in FIG. 23, the corner of the STI edge 9 is rounded, and the corner of the SOI edge 10 before recessing is also rounded. At this time, the amount of oxidation is adjusted so that the STI edge curvature radius $R_{BB}$ is larger than or equal to 1 nm and smaller than or equal to 20 nm, for example, 7 nm. At the same time, the thickness of the BOX layer 2 near the STI edge 9 is slightly thickened.

Next, as illustrated in FIG. 24, exposed part of the SOI layer 1 is removed by anisotropic dry etching with using the silicon nitride film 12 as a mask. According to this process, the structure in which the SOI edge 10 is recessed from the STI edge 9 is finished. Since the recessed SOI edge 10 is an edge surface made by dry etching, it is not rounded at the moment. The edge portion will be slightly rounded by steps of forming a gate insulating film etc. carried out layer. Meanwhile, the curvature radius is not as large as that illustrated in FIG. 23 described above, and the thickness of the BOX layer 2 just under the SOI edge 10 is not changed.

According to the second embodiment, similarly to the first embodiment described above, a field-effect transistor having electrical characteristics including a small channel-width dependency can be formed.

Third Embodiment

Figure 25:
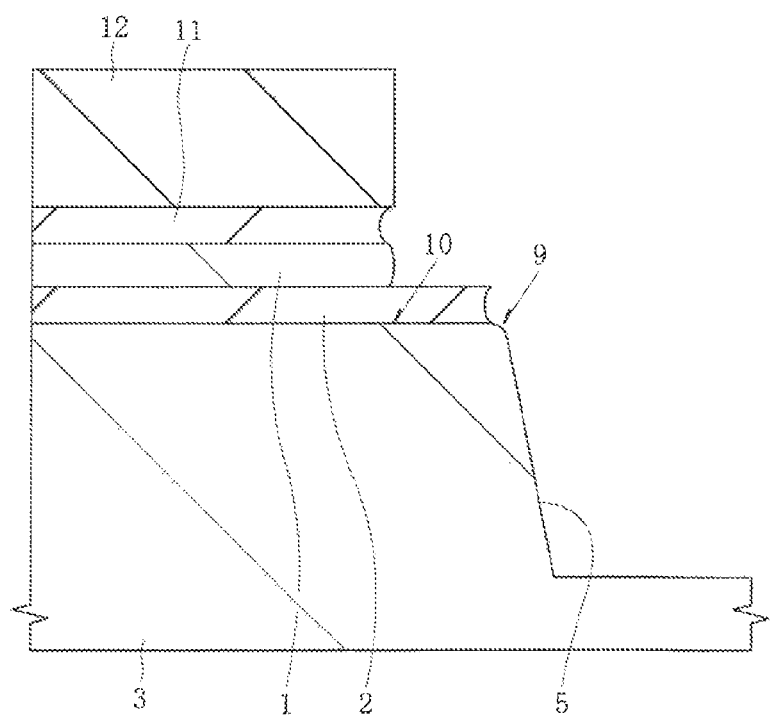
FIG. 25 is a cross-sectional view of a main part of a semiconductor substrate illustrating a manufacturing process of a field-effect transistor according to a third embodiment.

A semiconductor device according to a third embodiment is the same with that of the second embodiment described above while a method of rounding the STI edge 9 is different from that of the second embodiment while the structure of the STI boundary portion Sj of the shallow-trench isolation 4 has the SOI edge 10 being recessed from the STI edge 9 and the STI edge 9 being rounded. A manufacturing step of such a shallow-trench isolation 4 will be described with reference to FIG. 25. FIG. 25 is a cross-sectional view of a main part illustrating a method of manufacturing a shallow-trench isolation. Note that the manufacturing process until forming the shallow trench 5 to the silicon substrate 3, removing the sidewall 13, and exposed part of the SOI layer 1 (FIG. 12 described above) is the same with that of the first embodiment described above, and thus descriptions thereof are omitted here.

First, the structure illustrated in FIG. 12 of the first embodiment described above, that is, the structure in which the SOI edge 10 is recessed from the STI edge 9 is obtained, and then the SOI substrate is subjected to a rapid thermal oxidation (ISSG: in-situ steam generation). In this manner, as illustrated in FIG. 25, the corner of the STI edge 9 is rounded, and the corner of the SOI edge 10 after recessing is also rounded a little. At this time, the amount of oxidation is adjusted so that the STI edge curvature radius $R_{BB}$ is, for example, 7 nm. Upon performing the oxidation process, the silicon substrate 1 right under the SOI edge 10 is not yet an edge portion. Thus, the amount of oxidation at this portion is smaller than that in the case of performing the oxidation process without recessing the SOI edge 10 (for example, the state illustrated in FIG. 23 described above).

In this manner, according to the third embodiment, similarly to the first embodiment described above, a field-effect transistor having small channel-width dependency can be formed. Meanwhile, since the thickness of the BOX layer 2 just under the SOI edge 10 is very slightly thickened, the channel-width dependency of the substrate-bias coefficient is slightly degraded as compared with that of the first and second embodiments.

Fourth Embodiment

Figure 26:
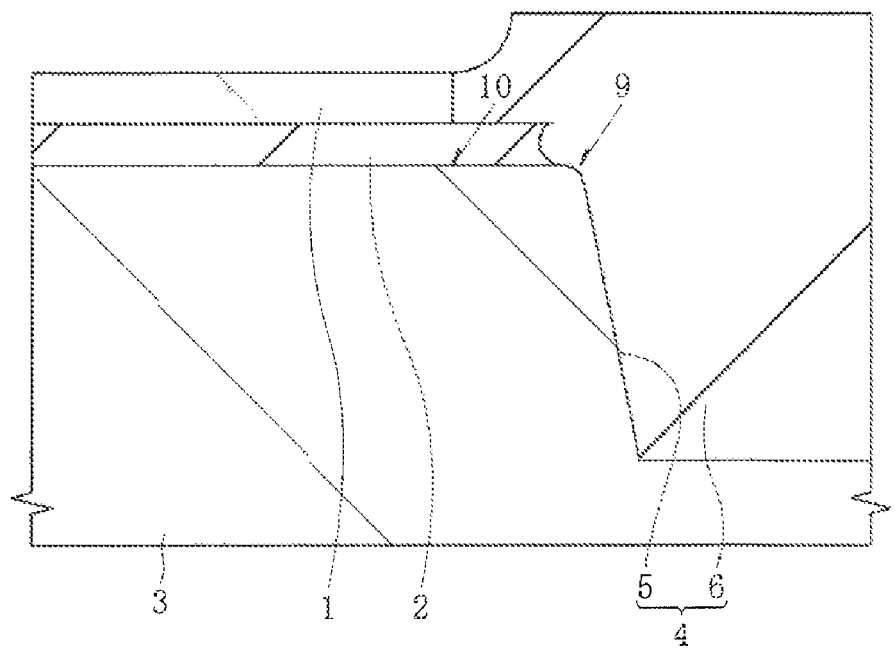
FIG. 26 is a cross-sectional view of a main part same as that of FIG. 25 in the manufacturing process of the field-effect transistor continued from FIG. 25.
Figure 27:
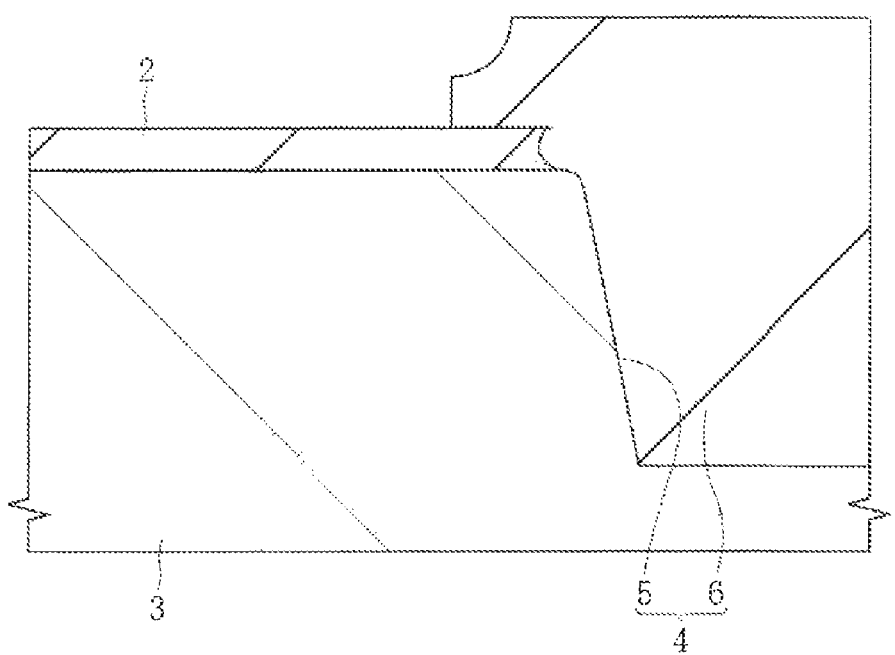
FIG. 27 is a cross-sectional view of a main part same as that of FIG. 25 in the manufacturing process of the field-effect transistor continued from FIG. 26.
Figure 28:
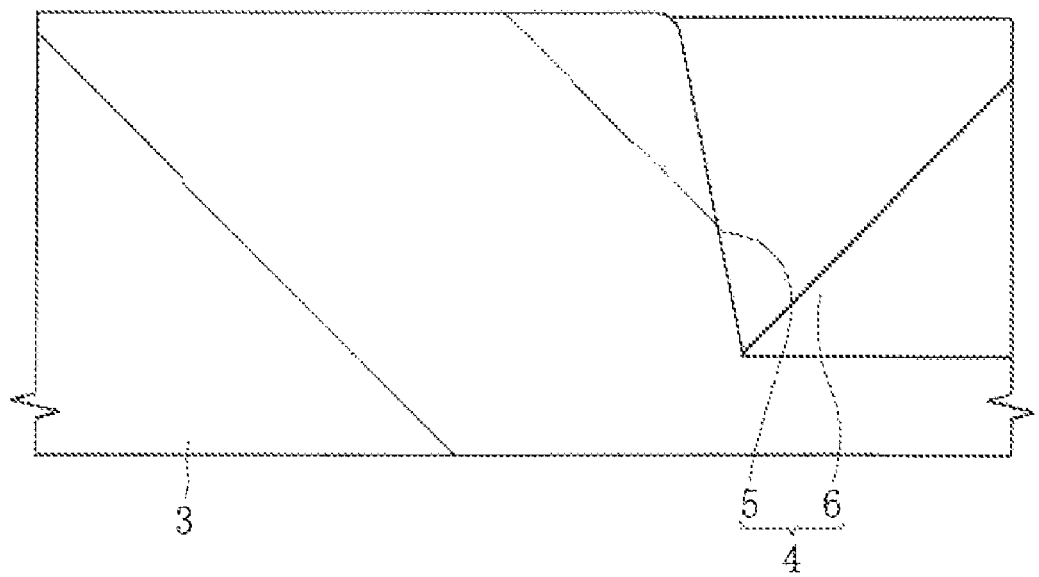
FIG. 28 is a cross-sectional view of a main part same as that of FIG. 25 in the manufacturing process of the field-effect transistor continued from FIG. 27.

In a semiconductor device of a fourth embodiment, an SOI device and a bulk device are formed on a main surface of the same substrate. Since a shallow-trench isolation of a region for forming the SOI device is formed in a method of manufacturing a shallow-trench isolation as that of the second embodiment described above, here, a method of manufacturing a shallow-trench isolation in a region for mainly forming the bulk device will be described. Such a method of manufacturing a shallow-trench isolation according to the fourth embodiment will be described in order of steps with reference to FIGS. 26 to 28. FIGS. 26 to 28 are cross-sectional views of a main part illustrating the method of manufacturing the shallow-trench isolation. Note that the manufacturing process until forming the shallow trench 5 to the silicon substrate 3, removing the sidewalls 13, and removing exposed part of the SOI layer 1 (FIG. 24 described above) is the same with that of the second embodiment described above, and thus descriptions thereof will be omitted.

First, the structure illustrated in FIG. 24 of the second embodiment described above, that is, the structure in which the SOI edge 10 is recessed from the STI edge 9 is formed. Subsequently, in the same manufacturing process as that described in the first embodiment described above with reference to FIGS. 13 to 16, the insulator 6 is buried in the shallow trench 5, and the silicon nitride film 12 is removed. In this manner, as illustrated in FIG. 26, the corner of the STI edge 9 is rounded, but little of the corner of the SOI edge 10 after recessing is rounded.

Then, as illustrated in FIG. 27, a resist pattern defining a bulk-device region is formed by photolithography, and the SOI layer 1 in the bulk-device region is removed by dry etching with using the resist pattern as a mask.

Next, as illustrated in FIG. 28, the BOX layer 2 is removed by wet etching. Further, as needed, a sacrificial oxidation process is performed to remove damage on the main surface of the silicon substrate 3, and a sacrificial oxide film formed by this sacrificial oxidation process is removed by wet etching. In addition, the amount of wet etching is suitably adjusted so that a height at the main surface of the silicon substrate 3 in the active region of the bulk device and a height at an upper surface of the insulator 6 of the shallow-trench isolation are suitable. Consequently, in the bulk device region, the kink does not occur in the Id-Vg characteristics of the field-effect transistor, and, in the SOI device region, the rounded shape of the SOI edge 10 which makes the SOI device characteristics suitable can be achieved, thereby enabling integration of the SOI device and the bulk device on the same substrate.

Thereafter, when forming the field-effect transistor, a gate insulating film, a gate electrode, and source/drain are formed. In accordance with circuits to which the field-effect transistor is used, for example, low-voltage logic circuits (in the present invention, the circuit is formed of the SOI device) or circuits handling high voltages such as input-output circuits or analog circuits (in the present invention, these circuits are formed of the bulk device), many design factors such as a thickness of the gate insulating film, a conductive material for forming the gate electrode (for example, while a gate electrode having the stacked structure formed of a titanium nitride film and a polycrystalline silicon film exemplified in the first embodiment described above is used for the SOI-type field-effect transistor, a gate electrode having a single-layer structure formed of a polycrystalline silicon film is used for the bulk-type field-effect transistor), threshold voltage, or a configuration of source/drain are optimized. These design factors are optimized in the same consideration as that of a conventional manufacturing process of the semiconductor device accommodating to a plurality of voltages, and thus the design factors do not affect the effects of the present invention.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention is applicable to a semiconductor device formed on an SOI substrate to be mounted on electronics equipments such as low-power information and communication equipments, personal digital appliances, intelligent home electronics, and mechanical devices.

What is claimed is:

1. A semiconductor device comprising a field-effect transistor formed on an SOI substrate formed of a silicon substrate and an SOI layer formed on a main surface of the silicon substrate via a BOX layer,
    wherein the field-effect transistor is formed in an active region of the SOI layer surrounded by a shallow-trench isolation, the shallow-trench isolation being formed of: a shallow trench formed in the silicon substrate penetrating through the SOI layer and the BOX layer; and an insulator buried inside the shallow trench,
    a first position at which the main surface of the silicon substrate and a line extended along a side surface of the SOI layer are crossed is recessed away from the shallow-trench isolation more than a second position at which a line extended along a sidewall of the shallow trench and a line extended along the main surface of the silicon substrate are crossed.

2. The semiconductor device according to claim 1,
    wherein an insulator integrated with the insulator buried inside the shallow trench is formed on the BOX layer in a region in which the SOI layer is not formed on the BOX layer.

3. The semiconductor device according to claim 1,
    wherein a thickness of the BOX layer is 10 nm.

4. The semiconductor device according to claim 1,
    wherein a gate width of a gate electrode of the field-effect transistor is smaller than or equal to 100 nm.

5. The semiconductor device according to claim 1,
    wherein a gate width of a gate electrode of the field-effect transistor is smaller than or equal to 50 nm.

6. The semiconductor device according to claim 1,
    wherein a distance from the first position at which the main surface of the silicon substrate and the line extended along the side surface of the SOI layer are crossed and the second position at which the line extended along the sidewall of the shallow trench and the line extended along the main surface of the silicon substrate are crossed is larger than zero.

7. The semiconductor device according to claim 1,
    wherein a distance from the first position at which the main surface of the silicon substrate and the line extended along the side surface of the SOI layer are crossed and the second position at which the line extended along the sidewall of the shallow trench and the line extended along the main surface of the silicon substrate are crossed is in a range of 5 to 30 nm.

8. The semiconductor device according to claim 1,
    wherein a corner of the silicon substrate at the second position at which the line extended along the sidewall of the shallow trench and the line extended along the main surface of the silicon substrate are crossed has a curved surface.

9. The semiconductor device according to claim 1,
    wherein a corner of the silicon substrate at the second position at which the line extended along the sidewall of the shallow trench and the line extended along the main surface of the silicon substrate are crossed has a curved surface having a curvature radius larger than or equal to 1 nm and smaller than or equal to 20 nm.

10. The semiconductor device according to claim 1,
    wherein a corner of the silicon substrate at the second position at which the line extended along the sidewall of the shallow trench and the line extended along the main surface of the silicon substrate are crossed has a curved surface, and, when a first distance is a distance from the first position at which the main surface of the silicon substrate and the line extended along the side surface of the SOI layer are crossed to the second position at which the line extended along the sidewall of the shallow trench and the line extended along the main surface of the silicon substrate are crossed; a second distance is a distance from a third position at which the curved surface and the main surface of the silicon substrate are crossed to the second position at which the line extended along the sidewall of the shallow trench and the line extended along the main surface of the silicon substrate are crossed; and a third distance is a difference between the first distance and the second distance, the third distance is larger than zero.

11. The semiconductor device according to claim 1, wherein a corner of the silicon substrate at the second position at which the line extended along the sidewall of the shallow trench and the line extended along the main surface of the silicon substrate are crossed has a curved surface, and, when a first distance is a distance from the first position at which the main surface of the silicon substrate and the line extended along the side surface of the SOI layer are crossed to the second position at which the line extended along the sidewall of the shallow trench and the line extended along the main surface of the silicon substrate are crossed; a second distance is a distance from a third position at which the curved surface and the main surface of the silicon substrate are crossed to the second position at which the line extended along the sidewall of the shallow trench and the line extended along the main surface of the silicon substrate are crossed; and a third distance is a difference between the first distance and the second distance, the third distance is larger than or equal to a half of the second distance.

12. The semiconductor device according to claim 1, wherein a corner of the silicon substrate at the second position at which the line extended along the sidewall of the shallow trench and the line extended along the main surface of the silicon substrate are crossed has a curved surface, and, when a first distance is a distance from the first position at which the main surface of the silicon substrate and the line extended along the side surface of the SOI layer are crossed to the second position at which the line extended along the sidewall of the shallow trench and the line extended along the main surface of the silicon substrate are crossed; a second distance is a distance from a third position at which the curved surface and the main surface of the silicon substrate are crossed to the second position at which the line extended along the sidewall of the shallow trench and the line extended along the main surface of the silicon substrate are crossed; and a third distance is a difference between the first distance and the second distance, the third distance is larger than or equal to a half of a curvature radius of the curved surface.

13. The semiconductor device according to claim 1, wherein a thickness of the BOX layer at a peripheral portion of the active region of the SOI layer surrounded by the shallow-trench isolation and a thickness of the BOX layer in a center portion of the active region of the SOI layer surrounded by the shallow-trench isolation are in the same range as a thickness distribution or a variation of the BOX layer allowed in manufacture.

14. The semiconductor device according to claim 1, wherein a number of electric lines of force passing through the BOX layer in a peripheral portion of the active region of the SOI layer surrounded by the shallow-trench isolation and reaching a gate electrode of the field-effect transistor from the silicon substrate is the same with a number of electric lines of force passing through the BOX layer in a center portion of the active region of the SOI layer surrounded by the shallow-trench isolation and reaching the gate electrode of the field-effect transistor from the silicon substrate.

15. A semiconductor device comprising: a first field-effect transistor in a first region of a main surface of a silicon substrate; and a second field-effect transistor in a second region of the main surface of the silicon substrate in which an SOI layer is formed via a BOX layer, wherein the first field-effect transistor is formed in an active region of the silicon substrate surrounded by a first shallow-trench isolation, the first shallow-trench isolation being formed of a first shallow trench formed in the silicon substrate and a first insulator buried inside the first shallow trench, a corner of the silicon substrate at a fourth position at which a line extended along a sidewall of the first shallow trench and a line extended along the main surface of the silicon substrate are crossed has a curved surface having a curvature radius larger than or equal to 1 nm and smaller than or equal to 20 nm, the second field-effect transistor is formed in an active region of the SOI layer surrounded by a second shallow-trench isolation, the second shallow-trench isolation being formed of: a second shallow trench penetrating through the SOI layer and the BOX layer and reaching the silicon substrate; and a second insulator buried inside the second shallow trench, and a first position at which the main surface of the silicon substrate and a line extended along a side surface of the SOI layer are crossed is recessed away from the second shallow-trench isolation more than a second position at which a line extended along a sidewall of the second shallow trench and a line extended along the main surface of the silicon substrate.

* * * * *